(12) United States Patent
Akae et al.

(10) Patent No.: US 8,673,790 B2
(45) Date of Patent: Mar. 18, 2014

(54) METHOD OF MANUFACTURING A SEMICONDUCTOR DEVICE, METHOD OF CLEANING A PROCESS VESSEL, AND SUBSTRATE PROCESSING APPARATUS

(75) Inventors: Naonori Akae, Toyama (JP); Yoshiro Hirose, Toyama (JP); Kotaro Murakami, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/155,997

(22) Filed: Jun. 8, 2011

(65) Prior Publication Data

US 2011/0318937 A1 Dec. 29, 2011

(30) Foreign Application Priority Data

Jun. 8, 2010 (JP) ................................ 2010-130937
Apr. 1, 2011 (JP) ................................ 2011-081983

(51) Int. Cl.
    *H01L 21/30* (2006.01)
(52) U.S. Cl.
    USPC .................................. 438/758; 257/E21.211
(58) Field of Classification Search
    USPC ................... 438/758; 257/E21.211; 118/724; 156/345.26
    See application file for complete search history.

(56) References Cited

U.S. PATENT DOCUMENTS

| 2002/0072211 | A1 | 6/2002 | Itatani et al. |
| 2002/0113056 | A1 | 8/2002 | Sugaya et al. |
| 2003/0037802 | A1* | 2/2003 | Nakahara et al. ............... 134/1.1 |
| 2005/0230047 | A1* | 10/2005 | Collins et al. ............. 156/345.33 |
| 2006/0281323 | A1 | 12/2006 | Ohmi et al. |
| 2008/0268644 | A1* | 10/2008 | Kameda et al. ................ 438/694 |
| 2009/0090384 | A1* | 4/2009 | You et al. ......................... 134/1.1 |
| 2009/0205676 | A1* | 8/2009 | Nakagawa ......................... 134/1 |
| 2009/0305517 | A1* | 12/2009 | Nakashima et al. ........... 438/786 |
| 2010/0012153 | A1* | 1/2010 | Shigemoto et al. ........... 134/22.1 |
| 2010/0210094 | A1* | 8/2010 | Furusawa et al. .............. 438/493 |

FOREIGN PATENT DOCUMENTS

| JP | 06-302565 A | 10/1994 |
| JP | 2002-180250 | 6/2002 |
| JP | 2004-335789 A | 11/2004 |
| KR | 10-1998-0080844 | 11/1998 |
| KR | 10-2003-0011568 | 2/2003 |
| KR | 2003-0038202 | 5/2003 |
| KR | 2003-0079786 | 10/2003 |
| WO | 2007-116768 A1 | 10/2007 |

* cited by examiner

*Primary Examiner* — William D Coleman
*Assistant Examiner* — Christine Enad
(74) *Attorney, Agent, or Firm* — Volpe and Koenig, P.C.

(57) ABSTRACT

A method of manufacturing a semiconductor device includes supplying a process gas into a process vessel accommodating a substrate to form a thin film on the substrate and supplying a cleaning gas into the process vessel to clean an inside of the process vessel, after the supplying the process gas to form the thin film is performed a predetermined number of times. When cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including the thin film adhering to the inside of the process vessel through a thermochemical reaction.

17 Claims, 10 Drawing Sheets

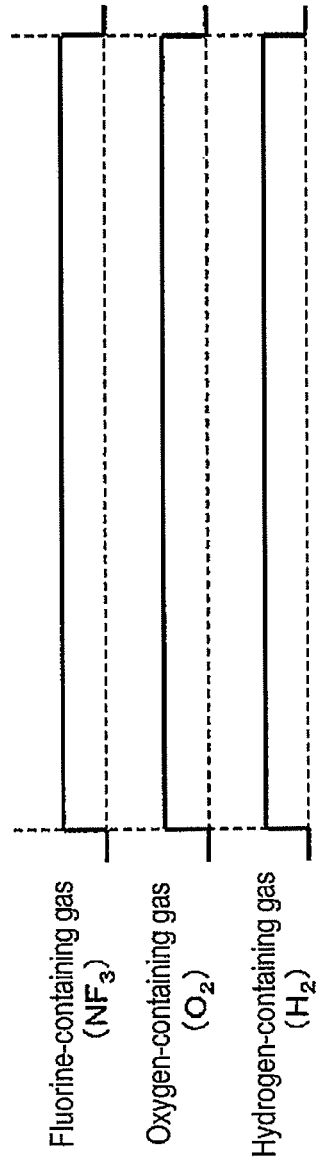

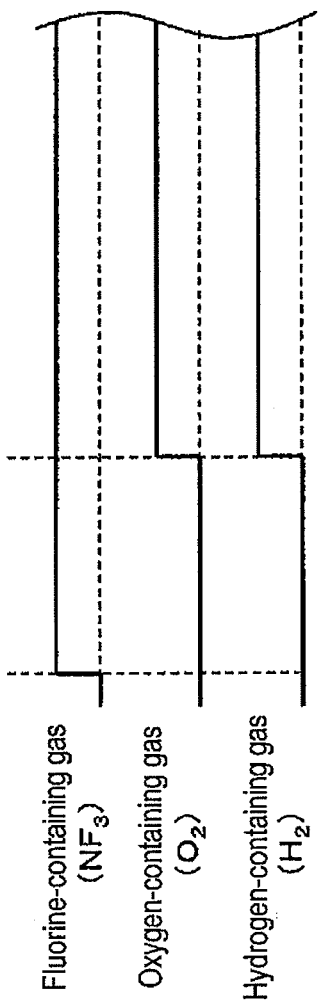

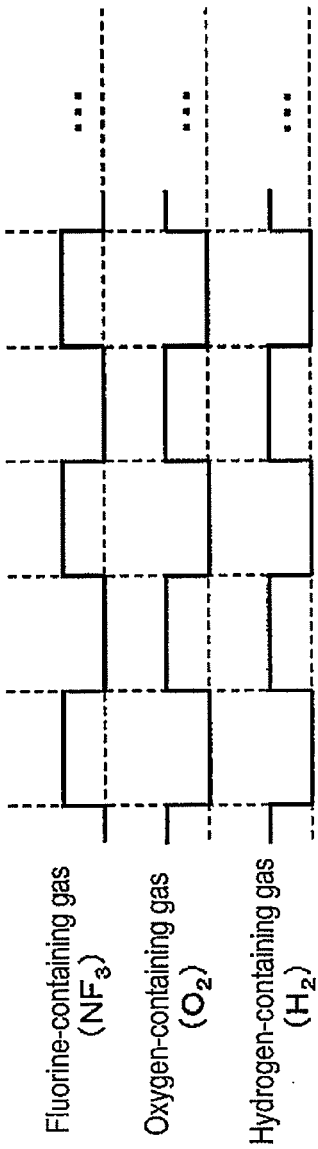

METHOD OF MANUFACTURING A SEMICONDUCTOR DEVICE, METHOD OF CLEANING A PROCESS VESSEL, AND SUBSTRATE PROCESSING APPARATUS

CROSS-REFERENCE TO RELATED APPLICATIONS

This application is based upon and claims the benefit of priority from Japanese Patent Application No. 2010-130937, filed on Jun. 8, 2010; and Japanese Patent Application No. 2011-81983, filed on Apr. 1, 2011, the entire contents of which are incorporated herein by reference.

TECHNICAL FIELD

The present disclosure relates to a method of manufacturing a semiconductor device which includes forming a thin film on a substrate, a method of cleaning an inside of a process vessel, and a substrate processing apparatus.

BACKGROUND

As one step of processes for manufacturing a semiconductor device, there is a thin film formation step in which a thin film, e.g., a silicon nitride film ($Si_3N_4$ film), is formed on a substrate such as a semiconductor wafer. The thin film formation step is performed by supplying a process gas into a process vessel containing a substrate. Although an object of the thin film formation step is to form a thin film on a substrate, in reality, a deposit including a thin film adheres to portions in addition to the substrate, e.g., the inner wall of the process vessel. The thickness (or amount) of a deposit adhering to the process vessel is gradually increased (e.g., in a cumulative manner) each time the thin film formation step is performed. If the thickness of such deposit reaches a certain level, a part of the deposit may be peeled from the inner wall of the process vessel. This may cause the generation of foreign substances (e.g., particles). If such foreign substances are generated within the process vessel and falls on the substrate, it may reduce a product yield rate of the manufacturing process. Therefore, the inside of the process vessel needs to be cleaned by removing any deposit formed thereon if the thickness of such deposit reaches a certain level.

Prevailing in the past were wet cleaning methods in which a member such as a reaction tube making up a process vessel is taken out from a substrate processing apparatus and then soaked in a cleaning tank containing an aqueous HF solution to remove a deposit adhering to the inner wall of the reaction tube. In recent years, dry cleaning methods have been widely used, which eliminate the need to take out a reaction tube or other members. In the dry cleaning methods, no operation is required to detach the reaction tube from the substrate processing apparatus. Further, any damage to the reaction tube or other members as a result of detaching can be prevented, which leads to the reduction of maintenance cost. Moreover, the dry cleaning methods shorten the time required to perform the cleaning operation until the thin film formation step is resumed. This may increase the productivity of the substrate processing apparatus. For example, in one of the dry cleaning methods, a cleaning gas including a fluorine-containing gas such as a nitrogen trifluoride ($NF_3$) gas, a fluorine ($F_2$) gas, or a chlorine trifluoride ($ClF_3$) gas is thermally activated and supplied into a process vessel (see International Publication No. WO2007/116768).

In a dry cleaning method, the etching rate of a deposit may be increased as the temperature within a process vessel is increased when a cleaning gas is supplied into the process vessel. However, the etching rate of quartz used as a material of a member such as a reaction tube arranged within the process vessel is also increased in proportion to the increase in the temperature within the process vessel. This poses a problem in that foreign substances are generated due to the damage to quartz. On the other hand, the damage to quartz may be reduced as the temperature within the process vessel becomes lower. However, this entails another problem of lowering the etching rate of a deposit within the process vessel. Accordingly, there is a need to realize a cleaning operation meeting two conflicting requirements, i.e., reduction of damage to quartz and increase of deposit etching rate.

SUMMARY

The present disclosure provides some embodiments of a method of manufacturing a semiconductor device, a method of cleaning an inside of a process vessel, and a substrate processing apparatus, which are capable of realizing a cleaning operation meeting two conflicting requirements, i.e., reduction of damage to quartz and increase of deposit etching rate within the process vessel.

According to one embodiment of the present disclosure, there is provided a method of manufacturing a semiconductor device, including: supplying a process gas into a process vessel accommodating a substrate to form a thin film on the substrate; and supplying a cleaning gas into the process vessel to clean an inside of the process vessel, after the supplying the process gas to form the thin film is performed a predetermined number of times, wherein, when cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including a thin film adhering to the inside of the process vessel through a thermochemical reaction.

According to another embodiment of the present disclosure, there is provided a method of cleaning an inside of a process vessel, including: providing a process vessel in which a process to form a thin film on a substrate is performed; and supplying a cleaning gas into the process vessel to clean the inside of the process vessel, after the process to form the thin film is performed a predetermined number of times, wherein, when cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including a thin film adhering to the inside of the process vessel through a thermochemical reaction.

According to still another embodiment of the present disclosure, there is provided a substrate processing apparatus including: a process vessel configured to accommodate a substrate; a process gas supply system configured to supply a process gas into the process vessel; a cleaning gas supply system configured to supply a cleaning gas into the process vessel; a heater configured to heat an inside of the process vessel; a pressure regulator configured to regulate an internal pressure of the process vessel; and a controller configured to control the process gas supply system, the cleaning gas supply system, the heater and the pressure regulator such that, after supplying the process gas into the process vessel accommodating the substrate to form a thin film on the substrate is performed a predetermined number of times, the cleaning gas is supplied into the process vessel to clean the inside of the process vessel, and such that, when cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including a thin film adhering to the inside of the process vessel through a thermochemical reaction.

BRIEF DESCRIPTION OF THE DRAWINGS

FIG. 7A is a gas supply timing chart showing a situation in which a fluorine-containing gas, an oxygen-containing gas and a hydrogen-containing gas are supplied simultaneously. FIG. 7B is a gas supply timing chart showing a situation in which the fluorine-containing gas is supplied prior to supplying the oxygen-containing gas and the hydrogen-containing gas.

FIG. 9 is a gas supply timing chart showing a situation in which the supply of the fluorine-containing gas is performed in an alternating manner in relation with the supply of the oxygen-containing gas and the hydrogen-containing gas.

DETAILED DESCRIPTION

Figure 1:
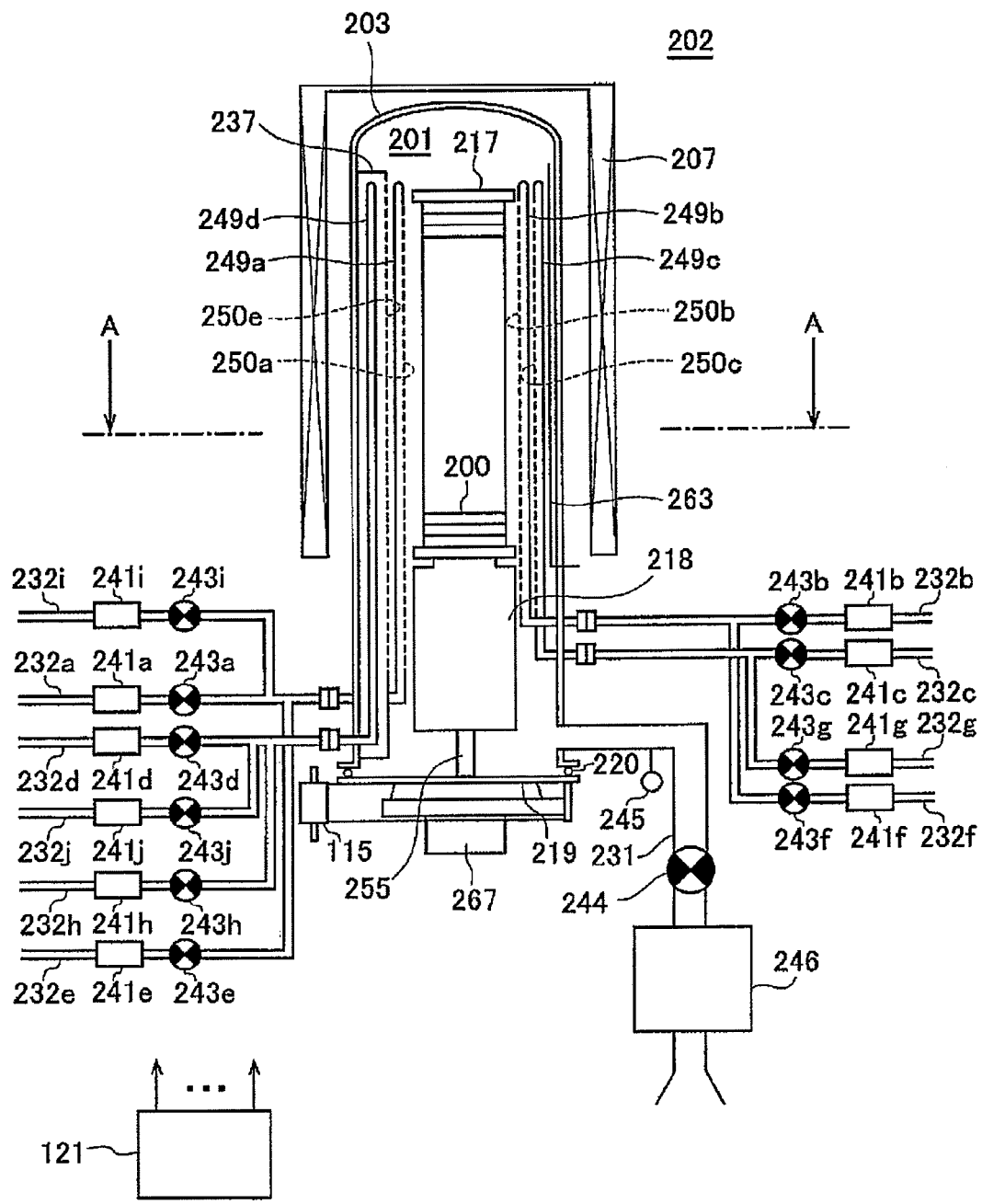
FIG. 1 is a schematic configuration view showing a vertical processing furnace of a substrate processing apparatus according to one embodiment, including a vertical cross-sectional view of the processing furnace.
Figure 2:
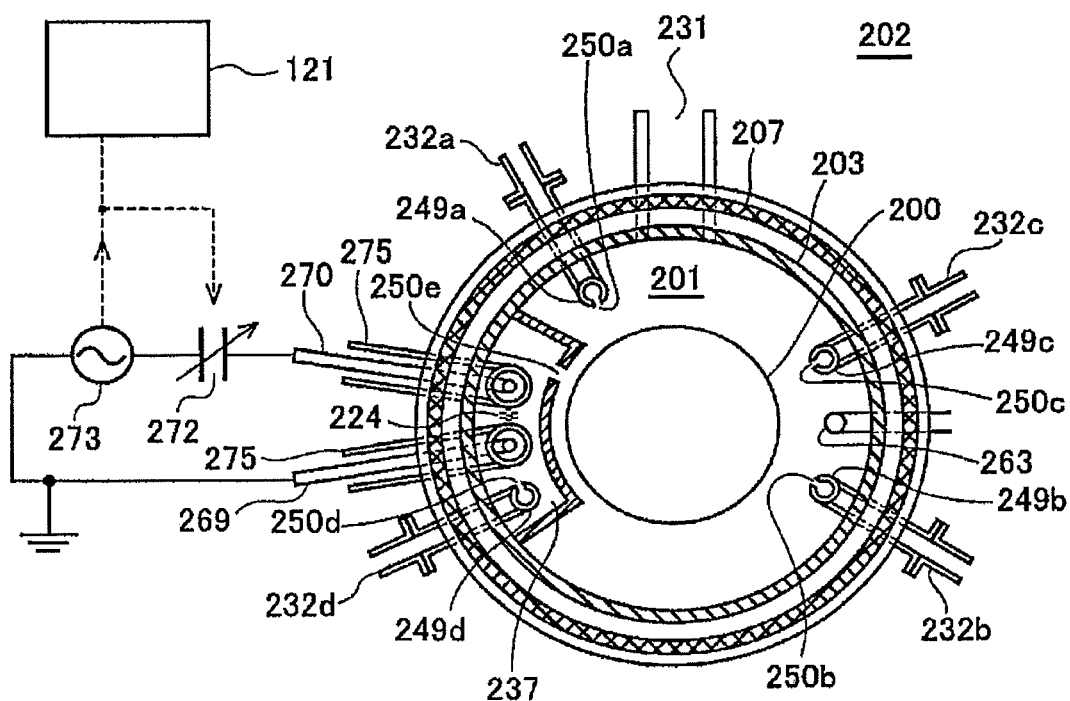
FIG. 2 is a schematic configuration view showing the vertical processing furnace of the substrate processing apparatus, including a cross-sectional view of the processing furnace taken along line A-A in FIG. 1.

Certain embodiments of the present disclosure will now be described with reference to the accompanying drawings.
(1) Configuration of Substrate Processing Apparatus FIG. 1 is a schematic configuration view showing a vertical processing furnace of a substrate processing apparatus according to one embodiment, including a vertical cross-sectional view of the processing furnace 202. FIG. 2 is a schematic configuration view showing the vertical processing furnace of the substrate processing apparatus, including a cross-sectional view of the processing furnace 202 taken along line A-A in FIG. 1.

Referring to FIG. 1, the processing furnace 202 includes a heater 207 serving as a heating means (heating mechanism). The heater 207 has a cylindrical shape and is vertically installed such that it is supported on a heater base (not shown) as a holding plate. As will be described later, the heater 207 also serves as an activating mechanism for thermally activating gases.

A reaction tube 203 making up a reaction vessel (or process vessel) is arranged inside the heater 207 so that it is concentrically aligned with the heater 207. The reaction tube 203 is made of a heat-resistant material such as quartz ($SiO_2$) or silicon carbide (SiC) and is formed in a cylindrical shape with a closed top end and an open bottom end. A process chamber 201 is defined in the tubular hollow space of the reaction tube 203. The process chamber 201 is configured to accommodate wafers 200 (used as substrates) which are stacked and arranged in a horizontal posture toward a vertical direction by a boat 217.

A first nozzle 249a, a second nozzle 249b, a third nozzle 249c and a fourth nozzle 249d are provided within the process chamber 201 and configured to pass through the lower portion of the reaction tube 203. A first gas supply pipe 232a, a second gas supply pipe 232b, a third gas supply pipe 232c and a fourth gas supply pipe 232d are connected to the first nozzle 249a, the second nozzle 249b, the third nozzle 249c and the fourth nozzle 249d, respectively. In this manner, four nozzles 249a, 249b, 249c and 249d and four gas supply pipes 232a, 232b, 232c and 232d are provided in the reaction tube 203 so that different types of gases can be supplied into the process chamber 201.

A mass flow controller (MFC) 241a (used as a flow rate controller or flow rate control unit) and a valve 243a (used as an on-off valve) are sequentially provided in the first gas supply pipe 232a from the upstream side thereof. A fifth gas supply pipe 232i is connected to the first gas supply pipe 232a at the downstream side of the valve 243a. A mass flow controller 241i (used as a flow rate controller or flow rate control unit) and a valve 243i (used as an on-off valve) are sequentially provided in the fifth gas supply pipe 232i from the upstream side thereof. A first inert gas supply pipe 232e is connected to the first gas supply pipe 232a at the downstream side of the connection point where the fifth gas supply pipe 232i is connected to the first gas supply pipe 232a. A mass flow controller 241e (used as a flow rate controller or flow rate control unit) and a valve 243e (used as an on-off valve) are sequentially provided in the first inert gas supply pipe 232e from the upstream side thereof. The first nozzle 249a mentioned above is connected to the tip end portion of the first gas supply pipe 232a. The first nozzle 249a is arranged within an arc-shaped space between the inner wall of the reaction tube 203 and the wafers 200 to extend upwards from the lower portion of the inner wall of the reaction tube 203 to the upper portion thereof in the stacking direction of the wafers 200. The first nozzle 249a is configured by an L-shaped elongated nozzle. Gas supply ports 250a for supplying a gas therethrough are provided on the side surface of the first nozzle 249a. The gas supply ports 250a are opened toward the center of the reaction tube 203. The gas supply ports 250a are provided in plural numbers along a vertical direction extending from the lower portion of the reaction tube 203 to the upper portion thereof. The respective gas supply ports 250a have the same opening area and are equally spaced apart from each other (i.e., have the equal opening pitch) along the vertical direction of the reaction tube 203. A first gas supply system is mainly configured by the first gas supply pipe 232a, the mass flow controller 241a, the valve 243a and the first nozzle 249a. A fifth gas supply system is mainly configured by the fifth gas supply pipe 232i, the mass flow controller 241i and the valve 243i. Further, a first inert gas supply system is mainly configured by the first inert gas supply pipe 232e, the mass flow controller 241e and the valve 243e.

A mass flow controller (MFC) 241b (used as a flow rate controller or flow rate control unit) and a valve 243b (used as an on-off valve) are sequentially provided in the second gas supply pipe 232b from the upstream side thereof. A second inert gas supply pipe 232f is connected to the second gas supply pipe 232b at the downstream side of the valve 243b. A mass flow controller 241f (used as a flow rate controller or flow rate control unit) and a valve 243f (used as an on-off valve) are sequentially provided in the second inert gas supply pipe 232f from the upstream side thereof. The second nozzle 249b mentioned above is connected to the tip end portion of the second gas supply pipe 232b. The second nozzle 249b is arranged within an arc-shaped space between the inner wall of the reaction tube 203 and the wafers 200 to extend upwards from the lower portion of the inner wall of the reaction tube 203 to the upper portion thereof in the stacking direction of the wafers 200. The second nozzle 249b is configured by an L-shaped elongated nozzle. Gas supply ports 250b for supplying a gas therethrough are provided on the side surface of the second nozzle 249b. The gas supply ports 250b are opened toward the center of the reaction tube 203. The gas supply ports 250b are provided in plural numbers along a vertical direction extending from the lower portion of the reaction tube 203 to the upper portion thereof. The respective gas supply ports 250b have the same opening area and are equally spaced apart from each other along the vertical direction of the reaction tube 203. A second gas supply system is mainly configured by the second gas supply pipe 232b, the mass flow controller 241b, the valve 243b and the second nozzle 249b. A second inert gas supply system is mainly configured by the second inert gas supply pipe 232f, the mass flow controller 241f and the valve 243f.

A mass flow controller (MFC) 241c (used as a flow rate controller or flow rate control unit) and a valve 243c (used as an on-off valve) are sequentially provided in the third gas supply pipe 232c from the upstream side thereof. A third inert gas supply pipe 232g is connected to the third gas supply pipe 232c at the downstream side of the valve 243c. A mass flow controller 241g (used as a flow rate controller or flow rate control unit) and a valve 243g (used as an on-off valve) are sequentially provided in the third inert gas supply pipe 232g from the upstream side thereof. The third nozzle 249c mentioned above is connected to the tip end portion of the third gas supply pipe 232c. The third nozzle 249c is arranged within an arc-shaped space between the inner wall of the reaction tube 203 and the wafers 200 to extend upwards from the lower portion of the inner wall of the reaction tube 203 to the upper portion thereof in the stacking direction of the wafers 200. The third nozzle 249c is configured by an L-shaped elongated nozzle. Gas supply ports 250c for supplying a gas therethrough are provided on the side surface of the third nozzle 249c. The gas supply ports 250c are opened toward the center of the reaction tube 203. The gas supply ports 250c are provided in plural numbers along a vertical direction extending from the lower portion of the reaction tube 203 to the upper portion thereof. The respective gas supply ports 250c have the same opening area and are equally spaced apart from each other along the vertical direction of the reaction tube 203. A third gas supply system is mainly configured by the third gas supply pipe 232c, the mass flow controller 241c, the valve 243c and the third nozzle 249c. A third inert gas supply system is mainly configured by the third inert gas supply pipe 232g, the mass flow controller 241g and the valve 243g.

A mass flow controller (MFC) 241d (used as a flow rate controller or flow rate control unit) and a valve 243d (used as an on-off valve) are sequentially provided in the fourth gas supply pipe 232d from the upstream side thereof. A sixth gas supply pipe 232j is connected to the fourth gas supply pipe 232d at the downstream side of the valve 243d. A mass flow controller 241j (used as a flow rate controller or flow rate control unit) and a valve 243j (used as an on-off valve) are sequentially provided in the sixth gas supply pipe 232j from the upstream side thereof. A fourth inert gas supply pipe 232h is connected to the fourth gas supply pipe 232d at the downstream side of the connection point where the sixth gas supply pipe 232j is connected to the fourth gas supply pipe 232d. A mass flow controller 241h (used as a flow rate controller or flow rate control unit) and a valve 243h (used as an on-off valve) are sequentially provided in the fourth inert gas supply pipe 232h from the upstream side thereof. The fourth nozzle 249d mentioned above is connected to the tip end portion of the fourth gas supply pipe 232d. The fourth nozzle 249d is provided within a buffer chamber 237 as a gas distribution space.

The buffer chamber 237 is provided within an arc-shaped space between the inner wall of the reaction tube 203 and the wafers 200 to extend from the lower portion of the inner wall of the reaction tube 203 to the upper portion thereof in the stacking direction of the wafers 200. Gas supply ports 250e for supplying a gas therethrough are provided in the end portion of the wall of the buffer chamber 237 adjoining to the wafers 200. The gas supply ports 250e are opened toward the center of the reaction tube 203. The gas supply ports 250e are provided in plural numbers along a vertical direction extending from the lower portion of the reaction tube 203 to the upper portion thereof. The respective gas supply ports 250e have the same opening area and are equally spaced apart from each other along the vertical direction of the reaction tube 203.

The fourth nozzle 249d is provided in one end portion of the buffer chamber 237 opposing to the other end portion having the gas supply ports 250e, extending upwards from the lower portion of the inner wall of the reaction tube 203 to the upper portion thereof in the stacking direction of the wafers 200. The fourth nozzle 249d is configured by an L-shaped elongate nozzle. Gas supply ports 250d for supplying a gas therethrough are provided on the side surface of the fourth nozzle 249d. The gas supply ports 250d are opened toward the center of the buffer chamber 237. Similar to the gas supply ports 250e of the buffer chamber 237, the gas supply ports 250d are provided in plural numbers along a vertical direction extending from the lower portion of the reaction tube 203 to the upper portion thereof. If the pressure difference between the buffer chamber 237 and the process chamber 201 is small, the respective gas supply ports 250d may have the same opening area and may be equally spaced apart from each other (i.e., have the same opening pitch) from the upstream side (the lower portion) to the downstream side (the upper portion). However, if the pressure difference is great, the respective opening areas may be adjusted to be greater or the respective opening pitches may be adjusted to be smaller from along a vertical direction of the fourth nozzle 249d extending from the upstream side toward the downstream side.

In the present embodiment, the opening area and the opening pitch of the respective gas supply ports 250d of the fourth nozzle 249d are adjusted from along a vertical direction of the fourth nozzle 249d extending from the upstream side toward the downstream side in the manner as mentioned above. Thus, a gas is discharged from the respective gas supply ports 250d at different flow velocities but at a substantially equal flow rate. Then, the gas discharged from the respective gas supply ports 250d is introduced into the buffer chamber 237 where the flow velocities of the gas are made uniform.

In other words, the gas is discharged from the respective gas supply ports 250d of the fourth nozzle 249d into the buffer chamber 237 where the particle velocity of the gas is reduced. Thereafter, the gas is discharged from the gas supply ports 250e of the buffer chamber 237 into the process chamber 201. As a result, the gas discharged from the respective gas supply ports 250d of the fourth nozzle 249d into the buffer chamber 237 has a uniform flow rate and a uniform flow velocity when it is discharged from the gas supply ports 250e of the buffer chamber 237 into the process chamber 201.

A fourth gas supply system is mainly configured by the fourth gas supply pipe 232d, the mass flow controller 241d, the valve 243d, the fourth nozzle 249d and the buffer chamber 237. A sixth gas supply system is mainly configured by the sixth gas supply pipe 232j, the mass flow controller 241j, the valve 243j, the fourth nozzle 249d and the buffer chamber 237. A fourth inert gas supply system is mainly configured by the fourth inert gas supply pipe 232h, the mass flow controller 241h and the valve 243h.

For example, a silicon source gas, i.e., a gas containing silicon (Si) (a silicon-containing gas) is supplied from the first gas supply pipe 232a into the process chamber 201 through the mass flow controller 241a, the valve 243a and the first nozzle 249a. As the silicon-containing gas, it is possible to use, e.g., a hexachlorodisilane ($Si_2Cl_6$, which is abbreviated as HCD) gas. In case of using a liquid source, such as HCD, which remains in a liquid state at room temperature and atmospheric pressure, the liquid source is vaporized by a vaporization system such as a vaporizer or a bubbler and then supplied as a source gas.

For example, a gas containing carbon (C) (a carbon-containing gas) is supplied from the second gas supply pipe 232b into the process chamber 201 through the mass flow controller 241b, the valve 243b and the second nozzle 249b. As the carbon-containing gas, it is possible to use, e.g., a propylene ($C_3H_6$) gas.

For example, a gas containing nitrogen (N) (a nitrogen-containing gas) is supplied from the third gas supply pipe 232c into the process chamber 201 through the mass flow controller 241c, the valve 243c and the third nozzle 249c. As the nitrogen-containing gas, it is possible to use, e.g., an ammonia ($NH_3$) gas.

For example, a gas containing oxygen (O) (an oxygen-containing gas) is supplied from the fourth gas supply pipe 232d into the process chamber 201 through the mass flow controller 241d, the valve 243d, the fourth nozzle 249d and the buffer chamber 237. As the oxygen-containing gas, it is possible to use, e.g., an oxygen ($O_2$) gas or a nitrous oxide ($N_2O$) gas.

A cleaning gas, e.g., a gas containing fluorine (F) (a fluorine-containing gas) is supplied from the fifth gas supply pipe 232i into the process chamber 201 through the mass flow controller 241i, the valve 243i and the first nozzle 249a. As the cleaning gas, it is possible to use, e.g., a nitrogen fluoride ($NF_3$) gas, a fluorine ($F_2$) gas, a chlorine fluoride ($ClF_3$) gas or a hydrogen fluoride (HF) gas.

For example, a gas containing hydrogen (H) (a hydrogen-containing gas) is supplied from the sixth gas supply pipe 232j into the process chamber 201 through the mass flow controller 241j, the valve 243j, the fourth nozzle 249d and the buffer chamber 237. As the hydrogen- containing gas, it is possible to use, e.g., a hydrogen ($H_2$) gas.

For example, a nitrogen ($N_2$) gas is supplied from the inert gas supply pipes 232e, 232f, 232g and 232h into the process chamber 201 through the mass flow controllers 241e, 241f, 241g and 241h; the valves 243e, 243f, 243g and 243h; the gas supply pipes 232a, 232b, 232c and 232d; the nozzles 249a, 249b, 249c and 249d and the buffer chamber 237.

In case the gases are supplied from the respective gas supply pipes in the manner as mentioned above, a source gas supply system, i.e., a silicon-containing gas supply system (a silane-based gas supply system) is configured by the first gas supply system. A carbon-containing gas supply system is configured by the second gas supply system. A nitrogen-containing gas supply system is configured by the third gas supply system. An oxygen-containing gas supply system is configured by the fourth gas supply system. A fluorine-containing gas supply system is configured by the fifth gas supply system. A hydrogen-containing gas supply system is configured by the sixth gas supply system.

If the silicon-containing gas, the carbon-containing gas and the nitrogen-containing gas are collectively referred to as process gas, a process gas supply system is configured by the silicon-containing gas supply system, the carbon-containing gas supply system and the nitrogen-containing gas supply system. If the carbon-containing gas and the nitrogen-containing gas are collectively referred to as reaction gas, a reaction gas supply system is configured by the carbon-containing gas supply system and the nitrogen-containing gas supply system. If the fluorine-containing gas, the oxygen-containing gas and the hydrogen-containing gas are collectively referred to as cleaning gas, a cleaning gas supply system is configured by the fluorine-containing gas supply system, the oxygen-containing gas supply system and the hydrogen-containing gas supply system. If the oxygen-containing gas and the hydrogen-containing gas are collectively referred to as additive gas, an additive gas supply system is configured by the oxygen-containing gas supply system and the hydrogen-containing gas supply system.

As shown in FIG. 2, a first rod-shaped electrode 269 (used as a first electrode of elongated structure) and a second rod-shaped electrode 270 (used as a second electrode of elongated structure) are arranged within the buffer chamber 237 along the stacking direction of the wafers 200, extending from the lower portion of the reaction tube 203 to the upper portion thereof. Each of the first rod-shaped electrode 269 and the second rod-shaped electrode 270 is provided parallel to the fourth nozzle 249d. Each of the first rod-shaped electrode 269 and the second rod-shaped electrode 270 is covered with and protected by an electrode protecting tube 275 (used as a tube for protection of each of the electrodes), which extends from the upper portion of each of the electrodes to the lower portion thereof. One of the first rod-shaped electrode 269 and the second rod-shaped electrode 270 is connected to a high-frequency power source 273 through a matching circuit 272. The other one of the first rod-shaped electrode 269 and the second rod-shaped electrode 270 is connected to a ground as a reference potential. As a consequence, plasma is generated in a plasma generation area between the first rod-shaped electrode 269 and the second rod-shaped electrode 270. A plasma source (used as a plasma generator or a plasma generating unit) is mainly configured by the first rod-shaped electrode 269, the second rod-shaped electrode 270, the electrode protecting tube 275, the matching circuit 272 and the high-frequency power source 273. As will be described later, the plasma source serves as a mechanism for activating a gas.

The electrode protecting tube 275 is configured to be inserted into the buffer chamber 237 with each of the first rod-shaped electrode 269 and the second rod-shaped electrode 270 isolated from the atmosphere of the buffer chamber 237. If the inside of the electrode protecting tube 275 has the same atmosphere as the ambient air, each of the first rod-shaped electrode 269 and the second rod-shaped electrode 270 inserted into the electrode protecting tube 275 may be oxidized by heat generated from the heater 207. To address this, an inert gas purge mechanism is provided for preventing oxidization of the first rod-shaped electrode 269 and the second rod-shaped electrode 270 by filling or purging the electrode protecting tube 275 with an inert gas such as nitrogen and sufficiently reducing the oxygen concentration in the electrode protecting tube 275.

An exhaust pipe 231 for vacuum-exhausting the process chamber 201 is provided in the reaction tube 203. A vacuum pump 246 (used as a vacuum exhaust device) is connected to the exhaust pipe 231 through a pressure sensor 245 (used as a pressure detector or pressure detecting unit) for detecting an internal pressure of the process chamber 201 and an APC (Automatic Pressure Controller) valve 244 (used as a pressure regulator or pressure regulating unit). The vacuum pump 246 is configured to vacuum-exhaust the process chamber 201 so that the internal pressure of the process chamber 201 can be adjusted to a specified pressure (vacuum degree). The APC valve 244 is an on-off valve configured to be opened or closed to vacuum-exhaust the process chamber 201 or stop vacuum-exhaust of the process chamber 201. The opening of the APC valve 244 can be adjusted to regulate the internal pressure of the process chamber 201. An exhaust system is mainly configured by the exhaust pipe 231, the APC valve 244, the vacuum pump 246 and the pressure sensor 245.

A seal cap 219 (used as a furnace opening lid) for air-tightly sealing the lower end opening of the reaction tube 203 is provided at the lower side of the reaction tube 203. The seal cap 219 is configured to abut against the lower end of the reaction tube 203 upward in a vertical direction. The seal cap 219 is made of metal, e.g., stainless steel, and is formed in a disc-like shape. An O-ring 220 (used as a seal member) for making contact with the lower end of the reaction tube 203 is provided on the upper surface of the seal cap 219. A rotation mechanism 267 for rotating a boat 217 is provided at the opposite side of the seal cap 219 from the process chamber 201. The rotation mechanism 267 includes a rotation shaft 255 extending through the seal cap 219 and connected to the boat 217 (which will be described later). The rotation mechanism 267 is configured to rotate the wafers 200 by rotating the boat 217. The seal cap 219 is configured to be vertically moved by a boat elevator 115 (used as a lift mechanism) vertically provided outside the reaction tube 203. This makes it possible to load and unload the boat 217 into and from the process chamber 201.

The boat 217 serving as a substrate holder is made of a heat-resistant material, e.g., quartz or silicon carbide, and is configured to hold a plurality of wafers 200 in a state where the plurality of wafers 200 are stacked and arranged in a horizontal posture with the centers thereof aligned with each other. A heat-insulating member 218 made of a heat-resistant material, e.g., quartz or silicon carbide, is provided below the boat 217. The heat-insulating member 218 is configured to make it difficult for the heat generated by the heater 207 to be transferred to the seal cap 219. The heat-insulating member 218 may be configured by a plurality of heat-insulating plates made of a heat-resistant material such as quartz or silicon carbide and a heat-insulating plate holder for holding the heat-insulating plates in a state where the heat-insulating plates are stacked in a horizontal posture.

A temperature sensor 263 (used as a temperature detector) is arranged within the reaction tube 203. By controlling the power supply to the heater 207 based on the temperature information detected by the temperature sensor 263, the internal temperature of the process chamber 201 is controlled to have a desired temperature distribution. Similar to the nozzles 249a, 249b, 249c and 249d, the temperature sensor 263 is formed in an L-like shape and is provided along the inner wall of the reaction tube 203.

A controller 121 (used as a control unit or control means) is connected to the mass flow controllers 241a, 241b, 241c, 241d, 241e, 241f, 241g, 241h, 241i and 241j; the valves 243a, 243b, 243c, 243d, 243e, 243f, 243g, 243h, 243i and 243j; the pressure sensor 245; the APC valve 244; the vacuum pump 246; the heater 207; the temperature sensor 263; the rotation mechanism 267; the boat elevator 115; the high-frequency power source 273; the matching circuit 272; and so forth. The controller 121 controls an adjustment operation of flow rates of various types of gases performed by the mass flow controllers 241a, 241b, 241c, 241d, 241e, 241f, 241g, 241h, 241i and 241j; an on/off operation of the valves 243a, 243b, 243c, 243d, 243e, 243f, 243g, 243h, 243i and 243j; an on/off operation of the APC valve 244 and a pressure regulating operation of the APC valve 244 pursuant to the pressure detected by the pressure sensor 245; a temperature adjustment operation of the heater 207 pursuant to the temperature detected by the temperature sensor 263; a startup and stop operation of the vacuum pump 246; a rotation speed adjustment operation of the rotation mechanism 267; a vertical movement operation of the boat elevator 115; a power supply operation of the high-frequency power source 273; and an impedance control operation of the matching circuit 272.

(2) Film Formation Operation

Next, description will be made for an example operation of forming a silicon carbon nitride film (SiCN film) as an insulating film on a substrate, as one step of processes for manufacturing a semiconductor device using the processing furnace of the substrate processing apparatus described above. In the following description, the operations of the respective units making up the substrate processing apparatus are controlled by the controller 121.

In the present embodiment, a silicon carbon nitride film having a specified thickness is formed on the wafers 200 by performing one or more cycles of a process that includes: an operation of forming a silicon-containing layer on the wafers 200 by supplying a silicon-containing gas into the process vessel accommodating the wafers 200 under a CVD reaction condition (a condition where a CVD reaction is caused); an operation of forming a carbon-containing layer on the silicon-containing layer to form a silicon-carbon-containing layer by supplying a carbon-containing gas into the process vessel; and an operation of nitriding the silicon-carbon-containing layer to form a silicon carbon nitride layer by supplying a nitrogen-containing gas into the process vessel.

Figure 3:
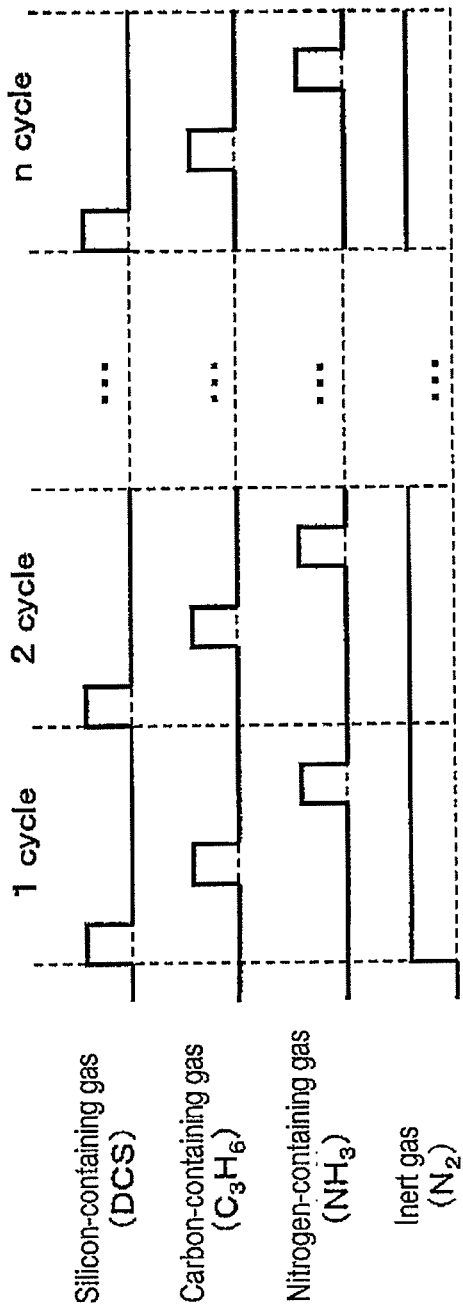
FIG. 3 is a view showing the gas supply timing in a film formation operation according to one embodiment.

Hereinafter, a substrate processing process according to the present embodiment will be described in detail. Described below is an example in which a silicon carbon nitride film (SiCN film) as an insulating film is formed on the wafers 200 through a sequence shown in FIG. 3 using an HCD gas as the silicon-containing gas, a $C_3H_6$ gas as the carbon-containing gas and an $NH_3$ gas as the nitrogen-containing gas.

If a plurality of wafers 200 is charged into the boat 217 (in a wafer charging operation), the boat 217 holding the wafers 200 is lifted up by the boat elevator 115 and loaded into the process chamber 201 as shown in FIG. 1 (in a boat loading operation). In this state, the seal cap 219 air-tightly seals the lower end of the reaction tube 203 through the O-ring 220.

The inside of the process chamber 201 is vacuum-exhausted by the vacuum pump 246 so that the internal pressure of the process chamber 201 can be adjusted to a desired pressure (vacuum degree). At this time, the internal pressure of the process chamber 201 is measured by the pressure sensor 245. The APC valve 244 is feedback controlled pursuant to the pressure information thus measured (in a pressure regulating operation). The inside of the process chamber 201 is heated by the heater 207 so that the internal temperature of the process chamber 201 can be adjusted to a desired temperature. At this time, the power supply to the heater 207 is feedback controlled pursuant to the temperature information detected by the temperature sensor 263 so that the inside of the process chamber 201 can have a desired temperature distribution (in a temperature adjusting operation). Then, the wafers 200 are rotated by allowing the rotation mechanism 267 to rotate the boat 217 (in a wafer rotating operation). Thereafter, three steps to be described later are sequentially performed.

[Step 1]

The valve 243a of the first gas supply pipe 232a is opened to allow an HCD gas to flow through the first gas supply pipe 232a. The flow rate of the HCD gas flowing through the first gas supply pipe 232a is adjusted by the mass flow controller 241a. The HCD gas, the flow rate of which has been adjusted, is supplied from the gas supply ports 250a of the first nozzle 249a into the process chamber 201 and then exhausted from the exhaust pipe 231. At this time, the valve 243e is simultaneously opened to allow an inert gas such as a $N_2$ gas to flow through the first inert gas supply pipe 232e. The flow rate of the $N_2$ gas flowing through the first inert gas supply pipe 232e is adjusted by the mass flow controller 241e. The $N_2$ gas, the flow rate of which has been adjusted, is supplied into the process chamber 201 together with the HCD gas and then exhausted from the exhaust pipe 231.

At this time, the APC valve 244 is suitably adjusted so that the internal pressure of the process chamber 201 can be kept within a range of, e.g., from 10 to 1,000 Pa. The supply flow rate of the HCD gas controlled by the mass flow controller 241a is set to fall within a range of, e.g., from 10 to 1,000 sccm. The supply flow rate of the $N_2$ gas controlled by the mass flow controller 241e is set to fall within a range of, e.g., from 200 to 2,000 sccm. The exposing time of the wafers 200 to the HCD gas, i.e., the gas supply time (gas irradiating time), is set to fall within a range of, e.g., from 1 to 120 seconds. At this time, the temperature of the heater 207 is set such that CVD reaction can occur within the process chamber 201, namely such that the temperature of the wafers 200 can be within a range of, e.g., from 300 to 700° C. If the temperature of the wafers 200 is less than 300° C., the HCD is hard to adsorb onto the wafers 200. If the temperature of the wafers 200 exceeds 700° C., the CVD reaction grows stronger and the uniformity of a layer to be formed tends to deteriorate. To address this, the temperature of the wafers 200 may be set in the range of from 300 to 700° C.

Upon supplying the HCD gas, a first layer containing silicon is formed on a base film of each of the wafers 200. In other words, a silicon layer (Si layer) as a silicon-containing layer ranging from less than one atomic layer to several atomic layers is formed on each of the wafers 200 (i.e., on a base film of each of the wafers 200). The silicon-containing layer may be a chemical adsorption layer of HCD. Silicon is an element that can become a solid body by itself. The silicon layer referred to herein includes not only a silicon-made continuous layer but also a silicon-made discontinuous layer or a thin film formed of the continuous layer and the discontinuous layer stacked on one another. In some embodiments, the silicon-made continuous layer may be referred to as a thin film. The chemical adsorption layer of HCD referred to herein includes not only a continuous chemical adsorption layer of HCD molecules but also a discontinuous chemical adsorption layer of HCD molecules. A layer having less than one atomic layer referred to herein means a discontinuously formed atomic layer. If the thickness of the silicon-containing layer formed on the wafers 200 is greater than several atomic layers, the nitriding action in Step 3 (which will be described later) may not reach the entirety of the silicon-containing layer. The minimum value (or thickness) of the silicon-containing layer that can be formed on the wafers 200 is less than one atomic layer. Accordingly, the thickness of the silicon-containing layer may range from less than one atomic layer to several atomic layers. Under a condition that the HCD gas is self-decomposed, silicon is deposited on the wafers 200 to form a silicon layer, i.e., a silicon deposition layer. Under a condition that the HCD gas is not self-decomposed, HCD is chemically adsorbed onto the wafers 200 to form a chemical adsorption layer of HCD. In some embodiments, an operation of forming the silicon layer on the wafers 200 may be performed rather than an operation of forming the chemical adsorption layer of HCD on the wafers 200 because the former operation may increase the deposition rate.

After the silicon-containing layer is formed on the wafers 200, the valve 243a is closed to stop supplying the HCD gas. At this time, the inside of the process chamber 201 is vacuum-exhausted by the vacuum pump 246 while keeping the APC valve 244 of the exhaust pipe 231 opened, thereby removing the unreacted HCD gas remaining in the process chamber 201 or the HCD gas contributed to the formation of the silicon-containing layer from the process chamber 201. At this time, the supply of the $N_2$ gas into the process chamber 201 is maintained by keeping the valve 243e opened. This helps enhance the effect of removing the unreacted HCD gas remaining in the process chamber 201 or the HCD gas contributed to the formation of the silicon-containing layer from the process chamber 201.

As the silicon-containing gas, it is possible to use not only the HCD gas but also an inorganic source such as a tetrachlorosilane ($SiCl_4$, which is abbreviated as STC) gas, a trichlorosilane ($SiHCl_3$, which is abbreviated as TCS) gas, a dichlorosilane ($SiH_2Cl_2$, which is abbreviated as DCS) gas, a monochlorosilane ($SiH_3Cl$, which is abbreviated as MCS) gas or a monosilane ($SiH_4$) gas, or an aminosilane-based organic source such as a tetrakis (dimethylamino) silane (Si[N(CH$_3$)$_2$]$_4$, which is abbreviated as 4DMAS) gas, a tris (dimethylamino) silane (Si[N(CH$_3$)$_2$]$_3$H, which is abbreviated as 3DMAS) gas, a bis (diethylamino) silane (Si[N(C$_2$H$_5$)$_2$]$_2$H$_2$, which is abbreviated as 2DEAS) gas or a bis (tertiary-butylamino) silane (SiH$_2$[NH(C$_4$H$_9$)]$_2$, which is abbreviated as BTBAS) gas. As the inert gas, it is possible to use not only the $N_2$ gas but also a rare gas such as an Ar gas, a He gas, a Ne gas or a Xe gas.

[Step 2]

After Step 1 is completed and the gas remaining within the process chamber 201 is removed, the valve 243b of the second gas supply pipe 232b is opened to allow a $C_3H_6$ gas to flow through the second gas supply pipe 232b. The flow rate of the $C_3H_6$ gas flowing through the second gas supply pipe 232b is adjusted by the mass flow controller 241b. The $C_3H_6$ gas, the flow rate of which has been adjusted, is supplied from the gas supply ports 250b of the second nozzle 249b into the process chamber 201 and then exhausted from the exhaust pipe 231. The $C_3H_6$ gas supplied into the process chamber 201 is thermally activated. At this time, the valve 243f is simultaneously opened to allow a $N_2$ gas to flow through the inert gas supply pipe 232f. The $N_2$ gas is supplied into the process chamber 201 together with the $C_3H_6$ gas and then exhausted from the exhaust pipe 231.

At this time, the APC valve 244 is suitably adjusted so that the internal pressure of the process chamber 201 can be kept within a range of, e.g., from 50 to 3,000 Pa. The supply flow rate of the $C_3H_6$ gas controlled by the mass flow controller 241b is set to fall within a range of, e.g., from 100 to 10,000 sccm. The supply flow rate of the $N_2$ gas controlled by the mass flow controller 241f is set to fall within a range of, e.g., from 200 to 2,000 sccm. At this time, the partial pressure of the $C_3H_6$ gas within the process chamber 201 is set to fall within a range of, e.g., from 6 to 2,940 Pa. The exposing time of the wafers 200 to the $C_3H_6$ gas, i.e., the gas supply time (gas irradiating time), is set to fall within a range of, e.g., from 1 to 120 seconds. At this time, the temperature of the heater 207 is set such that, similar to Step 1, the temperature of the wafers 200 can be within a range of from 300 to 700° C. If the $C_3H_6$ gas is supplied in a thermally activated state, it may induce a soft reaction, which facilitates forming a carbon-containing layer (which will be described later).

At this time, while the thermally activated $C_3H_6$ gas flows into the process chamber 201, the HCD gas does not flow into the process chamber 201. Thus, the $C_3H_6$ gas is supplied to the wafers 200 in an activated state without causing a gas-phase reaction, at which time a carbon-containing layer having less than one atomic layer, i.e., a discontinuous carbon-containing layer, is formed on the silicon-containing layer previously formed on the wafers 200 in Step 1. As a result, a second layer containing silicon and carbon is formed on the wafers 200. Depending on the conditions, in some cases, a portion of the silicon-containing layer may react with the $C_3H_6$ gas, which makes the silicon-containing layer modified (carbonized) to form a second layer containing silicon and carbon.

The carbon-containing layer formed on the silicon-containing layer may be either a carbon layer (C layer) or a chemical adsorption layer of $C_3H_6$, i.e., a chemical adsorption layer of a decomposed substance ($C_xH_y$) of $C_3H_6$. In this case, the carbon layer may be a carbon-made discontinuous layer. The chemical adsorption layer of $C_xH_y$ may be a discontinuous chemical adsorption layer of $C_xH_y$ molecules. In case the carbon-containing layer formed on the silicon-containing layer is a continuous layer, the adsorption state of $C_xH_y$ onto the silicon-containing layer is kept in a saturated state. If a continuous chemical adsorption layer of $C_xH_y$ is formed on the silicon-containing layer, the entire surface of the silicon-containing layer is covered with a chemical adsorption layer of $C_xH_y$. In this case, silicon does not exist on the surface of the second layer, which makes it difficult for the second layer to make a nitriding reaction in Step 3 (which will be described later). This is because nitrogen binds to silicon but does not bind to carbon. In order to cause such a nitriding reaction as in Step 3 (which will be described later), it is necessary to keep the adsorption state of $C_xH_y$ onto the silicon-containing layer in an unsaturated state and to keep silicon exposed on the surface of the second layer.

While the aforementioned process conditions may be used in Step 2 to keep the adsorption state of $C_xH_y$ onto the silicon-containing layer in the unsaturated state, the following process conditions may also be used in Step 2 to facilitate keeping the adsorption state of $C_{xy}$ onto the silicon-containing layer in the unsaturated state:.

Wafer temperature: 500 to 630° C.
Internal pressure of process chamber: 133 to 2,666 Pa
Partial pressure of $C_3H_6$ gas: 67 to 2,820 Pa
Supply flow rate of $C_3H_6$ gas: 1,000 to 5,000 sccm
Supply flow rate of $N_2$ gas: 300 to 1,000 sccm
Supply time of $C_3H_6$ gas: 6 to 100 seconds Thereafter, the valve 243b of the second gas supply pipe 232b is closed to stop supplying the $C_3H_6$ gas. At this time, the inside of the process chamber 201 is vacuum-exhausted by the vacuum pump 246 while keeping the APC valve 244 of the exhaust pipe 231 opened, thereby removing the unreacted $C_3H_6$ gas remaining in the process chamber 201 or the $C_3H_6$ gas contributed to the formation of the carbon-containing layer from the process chamber 201. At this time, the supply of the $N_2$ gas into the process chamber 201 is maintained by keeping the valve 243f opened. This helps enhance the effect of removing the unreacted $C_3H_6$ gas remaining in the process chamber 201 or the $C_3H_6$ gas contributed to the formation of the carbon-containing layer from the process chamber 201.

As the carbon-containing gas, it is possible to use not only the $C_3H_6$ gas but also an ethylene ($C_2H_4$) gas or an acetylene ($C_2H_2$) gas.

[Step 3]

After removing the gas remaining in the process chamber 201, the valve 243c of the third gas supply pipe 232c is opened to allow an $NH_3$ gas to flow through the third gas supply pipe 232c. The flow rate of the $NH_3$ gas flowing through the third gas supply pipe 232c is adjusted by the mass flow controller 241c. The $NH_3$ gas, the flow rate of which has been adjusted, is supplied from the gas supply ports 250c of the third nozzle 249c into the process chamber 201 and then exhausted from the exhaust pipe 231. The $NH_3$ gas supplied into the process chamber 201 is thermally activated. At this time, the valve 243g is simultaneously opened to allow a $N_2$ gas to flow through the inert gas supply pipe 232g. The $N_2$ gas is supplied into the process chamber 201 together with the $NH_3$ gas and then exhausted from the exhaust pipe 231.

When thermally activating and supplying the $NH_3$ gas, the APC valve 244 is suitably adjusted so that the internal pressure of the process chamber 201 can be kept within a range of, e.g., from 50 to 3,000 Pa. The supply flow rate of the $NH_3$ gas controlled by the mass flow controller 241d is set to fall within a range of, e.g., from 100 to 10,000 sccm. The supply flow rate of the $N_2$ gas controlled by the mass flow controller 241g is set to fall within a range of, e.g., from 200 to 2,000 sccm. At this time, the partial pressure of the $NH_3$ gas within the process chamber 201 is set to fall within a range of, e.g., from 6 to 2,940 Pa. The exposing time of the wafers 200 to the $NH_3$ gas, i.e., the gas supply time (gas irradiating time), is set to fall within a range of, e.g., from 1 to 120 seconds. At this time, the temperature of the heater 207 is set such that, similar to Step 1, the temperature of the wafers 200 can be within a range of from 300 to 700° C. Since the $NH_3$ gas reacts at a high temperature and may not sufficiently react at the wafer temperature mentioned above, the internal pressure of the process chamber 201 is kept at a relatively high value as describe above, to thereby thermally activate the $NH_3$ gas. If the $NH_3$ gas is supplied in a thermally activated state, it may facilitate performing a soft reaction, which makes it possible to softly perform the below-mentioned nitriding.

At this time, while the thermally activated $NH_3$ flows into the process chamber 201, neither the HCD gas nor the $C_3H_6$ gas flows into the process chamber 201. Thus, the $NH_3$ gas does not make any gas-phase reaction. The activated $NH_3$ gas reacts with a portion of the silicon-carbon-containing layer as the second layer formed on the wafers 200 in Step 2. Consequently, the second layer is thermally nitrided in a non-plasma fashion and is modified to a layer containing silicon, carbon and nitrogen, namely a silicon carbon nitride layer (SiCN layer).

At this time, the nitriding reaction of the second layer is required not to saturate. For example, if a silicon layer having several atomic layers is formed in Step 1 and if a carbon-containing layer having less than one atomic layer is formed in Step 2, the surface layer (one atomic layer on the surface) is nitrided partially. In other words, the area of the surface layer where nitriding can occur (or where silicon is exposed)

is nitrided partially or in its entirety. In this case, nitriding is performed under a condition that the nitriding reaction of the second layer remains unsaturated, so as not to nitride the entirety of the second layer. Depending on the conditions, nitriding may be performed on several layers existing under the surface layer of the second layer. However, in an alternate embodiment, nitriding may be performed only on the surface layer of the second layer, which enhances the controllability of a composition ratio of the silicon carbon nitride film. Further, for example, if a silicon layer having one atomic layer or less than one atomic layer is formed in Step 1 and if a carbon-containing layer having less than one atomic layer is formed in Step 2, the surface layer is partially nitrided as mentioned above. In this case, nitriding is performed under a condition that the nitriding reaction of the second layer remains unsaturated, so as not to nitride the entirety of the second layer.

While the afore-mentioned process conditions may be used in Step 3 to keep the nitriding reaction of the second layer unsaturated, the following process conditions may also be used in Step 3 to facilitate keeping the nitriding reaction of the second layer unsaturated:.

Wafer temperature: 500 to 630° C.
Internal pressure of process chamber: 133 to 2,666 Pa
Partial pressure of $NH_3$ gas: 67 to 2,820 Pa
Supply flow rate of $NH_3$ gas: 1,000 to 5,000 sccm
Supply flow rate of $N_2$ gas: 300 to 1,000 sccm
Supply time of $NH_3$ gas: 6 to 100 seconds Thereafter, the valve 243c of the third gas supply pipe 232c is closed to stop supplying the $NH_3$ gas. At this time, the inside of the process chamber 201 is vacuum-exhausted by the vacuum pump 246 while keeping the APC valve 244 of the exhaust pipe 231 opened, thereby removing the unreacted $NH_3$ gas remaining in the process chamber 201 or the $NH_3$ gas contributed to the nitriding from the process chamber 201. At this time, the supply of the $N_2$ gas into the process chamber 201 is maintained by keeping the valve 243g opened. This helps enhance the effect of removing the unreacted $NH_3$ gas remaining in the process chamber 201 or the $NH_3$ gas contributed to the nitriding from the process chamber 201.

As the nitrogen-containing gas, it is possible to use not only the $NH_3$ gas but also a gas such as a diazine ($N_2H_2$) gas, a hydrazine ($N_2H_4$) gas or a $N_3H_8$ gas, or an amine-based compound gas such as a trimethylamine ($N(CH_3)_3$) gas or a triethylamine ($N(C_2H_5)_3$) gas.

By performing a process cycle including Steps 1, 2 and 3 once or more (a predetermined number of times), it is possible to form a thin film of predetermined thickness containing silicon, carbon and nitrogen, namely a silicon carbon nitride film (SiCN film) on the wafers 200. Specifically, the above-mentioned process cycle may be performed a plurality of times.

At this time, by controlling the processing conditions in the respective steps such as the internal pressure of the process chamber 201 and the gas supply time, it is possible to adjust the ratio of the respective element components of the SiCN film such as the silicon component, the carbon component and the nitrogen component, more specifically the silicon concentration, the carbon concentration and the nitrogen concentration, which makes it possible to control the composition ratio of the SiCN film.

Upon finishing the film-forming process for forming the SiCN film of predetermined thickness, an inert gas such as a $N_2$ gas is supplied into and exhausted from the process chamber 201 to purge the inside of the process chamber 201 with the inert gas (in a gas purging operation). Thereafter, the atmosphere within the process chamber 201 is substituted by the inert gas (in an inert gas substitution operation) and the internal pressure of the process chamber 201 is restored to a normal pressure (in an atmospheric pressure restoration operation).

Thereafter, the seal cap 219 is lowered down by the boat elevator 115 to open the lower end of the reaction tube 203. The boat 217 holding the processed wafers 200 is unloaded to the outside of the reaction tube 203 from the lower end of the reaction tube 203 (in a boat unloading operation). Then, the processed wafers 200 are taken out from the boat 217 (in a wafer discharging operation).

In the substrate processing process described above, it is also possible to form a thin film of predetermined thickness containing silicon and nitrogen, namely a silicon nitride film (SiN film), on the wafers 200 by performing a process cycle including Steps 1 and 3 once or more. In this case, the above-mentioned process cycle may be performed multiple times. Moreover, it is possible to form a thin film of predetermined thickness containing silicon, namely a silicon film (Si film) such as a polycrystalline silicon film (poly-Si film) or an amorphous silicon film (a-Si film), on the wafers 200 by performing only Step 1.

(3) Cleaning Step

Next, description will be made on a method of cleaning the inside of the process chamber 201. In the following description, the operations of the respective units making up the substrate processing apparatus are controlled by the controller 121.

If the above-described film formation operations are repeated, the thin film such as the SiCN film is accumulated in the inside of the process chamber 201 such as the inner wall of the reaction tube 203. In other words, a deposit including a thin film adheres to the inner wall of the reaction tube 203 or other places. The inside of the process chamber 201 is subjected to cleaning at the time when the thickness of the deposit adhering to the inner wall (the thickness of the accumulated thin film) reaches a predetermined thickness prior to occurrence of peeling and falling of the deposit. The cleaning is performed by supplying, a cleaning gas, e.g., a mixture of a fluorine-containing gas, an oxygen-containing gas and a hydrogen-containing gas, into the process chamber 201 heated to a predetermined temperature and kept at a pressure less than the atmospheric pressure and removing the deposit including the thin film such as the SiCN film adhering to the inside of the process chamber 201 through a thermochemical reaction.

Hereinafter, the cleaning step according to the present embodiment will be described in detail. Specifically, the following is a description of an example cleaning step in which the deposit including the thin film such as the SiCN film adhering to the inside of the process chamber 201 is removed by thermally etching under a non-plasma atmosphere using an $NF_3$ gas as the fluorine-containing gas, an $O_2$ gas as the oxygen-containing gas and a $H_2$ gas as the hydrogen-containing gas.

An empty boat 217, i.e., a boat 217 not charged with the wafers 200, is lifted up and loaded into the process chamber 201 by the boat elevator 115 (in a boat loading operation). In this state, the seal cap 219 air-tightly seals the lower end of the reaction tube 203 through the O-ring 220.

The inside of the process chamber 201 is vacuum-exhausted by the vacuum pump 246 so that the internal pressure of the process chamber 201 can be kept at a desired pressure (vacuum degree). At this time, the internal pressure of the process chamber 201 is measured by the pressure sensor 245, and the APC valve 244 is feedback controlled pursuant to the pressure information thus measured. Further, the inside of the process chamber 201 is heated by the heater 207 so that the internal temperature of the process chamber 201 can be kept at a desired temperature. At this time, the power supply to the heater 207 is feedback controlled pursuant to the temperature information detected by the temperature sensor 263 so that the inside of the process chamber 201 can have a desired temperature distribution. If the internal pressure and the internal temperature of the process chamber 201 reach a predetermined pressure and a predetermined temperature, respectively, a control operation is performed to maintain the predetermined pressure and the predetermined temperature. Then, the boat 217 is rotated by the rotation mechanism 267. In an alternate embodiment, the boat 217 may be kept stationary without being rotated.

In the state that the internal pressure and the internal temperature of the process chamber 201 are maintained at the predetermined pressure and the predetermined temperature, the valve 243i of the fifth gas supply pipe 232i is opened to allow an $NF_3$ gas to flow through the fifth gas supply pipe 232i. The flow rate of the $NF_3$ gas flowing through the fifth gas supply pipe 232i is adjusted by the mass flow controller 241i. The $NF_3$ gas, the flow rate of which has been adjusted, flows through the first gas supply pipe 232a. Then, the $NF_3$ gas is supplied from the gas supply ports 250a of the first nozzle 249a into the process chamber 201 and then exhausted from the exhaust pipe 231. At this time, the valve 243e may be opened to allow an inert gas such as a $N_2$ gas to flow through the first inert gas supply pipe 232e so that the $NF_3$ gas can be diluted with the $N_2$ gas. The flow rate of the $N_2$ gas flowing through the first inert gas supply pipe 232e is adjusted by the mass flow controller 241e. The $N_2$ gas, the flow rate of which has been adjusted, is supplied into the process chamber 201 together with the $NF_3$ gas and then exhausted from the exhaust pipe 231. The concentration of the $NF_3$ gas may be controlled by controlling the supply flow rate of the $N_2$ gas.

At this time, the valve 243d is simultaneously opened to allow an $O_2$ gas to flow through the fourth gas supply pipe 232d. The flow rate of the $O_2$ gas flowing through the fourth gas supply pipe 232d is adjusted by the mass flow controller 241d. The $O_2$ gas, the flow rate of which has been adjusted, continues to flow through the fourth gas supply pipe 232d and is supplied from the gas supply ports 250d of the fourth nozzle 249d into the buffer chamber 237 kept in a heated and depressurized state. At this time, the valve 243j is simultaneously opened to allow a $H_2$ gas to flow through the sixth gas supply pipe 232j. The flow rate of the $H_2$ gas flowing through the sixth gas supply pipe 232j is adjusted by the mass flow controller 241j. The $H_2$ gas, the flow rate of which has been adjusted, flows through the sixth gas supply pipe 232j and the fourth gas supply pipe 232d and is supplied from the gas supply ports 250d of the fourth nozzle 249d into the buffer chamber 237 kept in a heated and depressurized state. When flowing through the fourth gas supply pipe 232d, the $H_2$ gas is mixed with the $O_2$ gas within the fourth gas supply pipe 232d. In other words, a mixed gas of the $O_2$ gas and the $H_2$ gas is supplied from the fourth nozzle 249d. The mixed gas of the $O_2$ gas and the $H_2$ gas within the buffer chamber 237 is supplied from the gas supply ports 250e of the buffer chamber 237 into the process chamber 201 kept in a heated and depressurized state and is exhausted from the exhaust pipe 231. At this time, the valve 243h of the fourth inert gas supply pipe 232h may be opened to supply a $N_2$ gas as an inert gas from the fourth inert gas supply pipe 232h. The $N_2$ gas, the flow rate of which is adjusted by the mass flow controller 241h, is supplied into the fourth gas supply pipe 232d. In this case, a mixed gas of the $O_2$ gas, the $H_2$ gas and the $N_2$ gas is supplied from the fourth nozzle 249d and the buffer chamber 237. As the inert gas, it is possible to use not only the $N_2$ gas but also a rare gas such as an Ar gas, a He gas, a Ne gas or a Xe gas.

In this manner, the $NF_3$ gas is introduced into the process chamber 201 from the first nozzle 249a, and at the same time, the mixed gas of the $O_2$ gas and the $H_2$ gas is introduced into the process chamber 201 from the buffer chamber 237. In other words, the $NF_3$ gas added with the $O_2$ gas and the $H_2$ gas are supplied into the process chamber 201 and exhausted from the exhaust pipe 231. When passing through the process chamber 201, the $NF_3$ gas, the $O_2$ gas and the $H_2$ gas make contact with the deposit including the thin film of SiCN or SiN accumulated on the inner wall of the reaction tube 203 or the surface of the boat 217, thereby removing the thin film by a thermochemical reaction under a non-plasma atmosphere. That is, the thin film is removed by the etching reaction of the deposit with etching species, e.g., active species generated by thermal decomposition or mutual reaction of the $NF_3$ gas, the $O_2$ gas and the $H_2$ gas. By simultaneously supplying the $O_2$ gas and the $H_2$ gas in addition to the $NF_3$ gas, the etching rate of the deposit can be increased under the action (which will be set forth later). Further, when passing through the first nozzle 249a, the $NF_3$ gas also makes contact with the Si-containing deposit accumulated on the inner wall of the first nozzle 249a, thereby removing the Si-containing deposit.

If the cleaning of the inside of the process chamber 201 is completed after the lapse of a predetermined thin film etching time, the valves 243i, 243d and 243j are closed to stop supplying the $NF_3$ gas, the $O_2$ gas and the $H_2$ gas into the process chamber 201. Thereafter, an $N_2$ gas is supplied into the process chamber 201 and exhausted from the exhaust pipe 231, thereby purging the inside of the process chamber 201.

Examples of the thin film etching conditions used in the cleaning step include as follows:

Internal temperature of process chamber: 300° C. to 700° C., more specifically, 400° C. to 600° C.

Internal pressure of process chamber: 133 Pa (1 Torr) to 53,200 Pa (400 Torr)

Supply flow rate of $NF_3$ gas: 0.1 to 5 slm

Supply flow rate of $O_2$ gas: 0.05 to 2.5 slm

Supply flow rate of $H_2$ gas: 0.05 to 2.5 slm

Supply flow rate of $N_2$ gas: 0 to 20 slm

Etching of the thin film, i.e., thermal etching is performed by maintaining the respective etching conditions at the values falling within the above ranges.

In the cleaning step, at least one or both of the $O_2$ gas and the $H_2$ gas may be activated with plasma when supplied. By activating the $O_2$ gas and/or the $H_2$ gas with plasma, it is possible to generate reactive species of higher energy. Further, the etching rate may be increased by adding the reactive species to the $NF_3$ gas. For example, when activating both the $O_2$ gas and the $H_2$ gas with plasma, high-frequency power is applied between the first rod-shaped electrode 269 and the second rod-shaped electrode 270 by the high-frequency power source 273 through the matching circuit 272, thereby plasma-exciting the mixed gas of the $O_2$ gas and the $H_2$ gas supplied into the buffer chamber 237. The plasma-excited mixed gas is supplied from the gas supply ports 250e into the process chamber 201 as active species and exhausted from the exhaust pipe 231. At this time, the high-frequency power applied between the first rod-shaped electrode 269 and the second rod-shaped electrode 270 from the high-frequency power source 273 is set to fall within a range of, e.g., from 50 W to 1,000 W. The other process conditions remain the same as the afore-mentioned process conditions. In the temperature range as mentioned above, the $O_2$ gas and the $H_2$ gas are thermally activated and adequately reacted to generate a sufficient amount of reactive species. Therefore, even when the $O_2$ gas and the $H_2$ gas are thermally activated in a non-plasma fashion, it is possible to significantly increase the etching rate. If the $O_2$ gas and the $H_2$ gas are supplied in a thermally activated state, it is possible to induce a soft reaction and to perform the etching process in a soft manner, which makes it possible to uniformly remove the deposit. In addition, if the cleaning is performed by thermal etching, namely by thermally activating the $O_2$ gas and the $H_2$ gas in a non-plasma state, which eliminates the need to use a plasma source.

As the fluorine-containing gas, it is possible to use not only the $NF_3$ gas but also a $F_2$ gas, a $ClF_3$ gas or a HF gas. Further, as the oxygen-containing gas, it is possible to use not only the $O_2$ gas but also an ozone ($O_3$) gas, a nitrogen monoxide (NO) gas or a nitrous oxide ($N_2O$) gas. As the hydrogen-containing gas, it is possible to use not only the $H_2$ gas but also a deuterium ($D_2$) gas, an ammonia ($NH_3$) gas or a methane ($CH_4$) gas.

(4) Effects Provided by the Present Embodiment

The present embodiment provides one or more effects set forth below.

According to the present embodiment, a mixture of a fluorine-containing gas ($NF_3$ gas), an oxygen-containing gas ($O_2$ gas) and a hydrogen-containing gas ($H_2$ gas) is supplied as a cleaning gas into the heated reaction tube 203 kept at a pressure less than the atmospheric pressure, thereby removing a deposit including a thin film (such as a SiCN film or a SiN film) adhering to the inside of the reaction tube 203. This makes it possible to increase the etching rate of a deposit while reducing damage to quartz used as a material of such a member as the reaction tube 203 or the boat 217.

As described above, the etching rate of a deposit can be increased by simultaneously adding an oxygen-containing gas ($O_2$ gas) and a hydrogen-containing gas ($H_2$ gas) to a fluorine- containing gas. This effect is attained presumably because the reactive species such as atomic oxygen (O), atomic hydrogen (H) or hydroxyl group molecules (OH) are generated by the reaction of the oxygen-containing gas ($O_2$ gas) and the hydrogen-containing gas ($H_2$ gas) in a heated and depressurized atmosphere, and such reactive species react with the fluorine-containing gas ($NF_3$ gas) to thereby facilitate the generation of etching species such as atomic fluorine (F) or a fluorine ($F_2$) gas. Further, the reaction of the oxygen-containing gas ($O_2$ gas) and the hydrogen-containing gas ($H_2$ gas) in a gas-phase state is accelerated as the internal pressure of the reaction tube 203 grows higher. This increases the probability of generating the reactive species such as atomic oxygen (O), atomic hydrogen (H) or hydroxyl group molecules (OH). As a result, the probability of reaction of the generated reactive species with the fluorine-containing gas ($NF_3$ gas) becomes greater, which in turn increases the generation quantity of etching species such as atomic fluorine (F) or a fluorine ($F_2$) gas.

Further, as described above, the damage to quartz can be reduced by simultaneously adding an oxygen-containing gas ($O_2$ gas) and a hydrogen-containing gas ($H_2$ gas) to a fluorine-containing gas. This effect is attained presumably because the reactive species such as atomic oxygen (O), atomic hydrogen (H) or hydroxyl group molecules (OH) are generated by the reaction of the oxygen-containing gas ($O_2$ gas) and the hydrogen-containing gas ($H_2$ gas) in a gas-phase state, and such reactive species act to take out impurities from the quartz surface exposed after removal of a deposit and act to modify quartz in such a manner as to increase the etching resistance of quartz against the atomic fluorine (F) or the fluorine ($F_2$) gas.

According to the present embodiment, cleaning is performed by thermal etching, namely by thermally activating a fluorine-containing gas, an oxygen-containing gas and a hydrogen-containing gas under a non-plasma atmosphere. This makes it possible to reduce damage to quartz caused by plasma while increasing the etching rate as mentioned above. Cleaning can be performed at the same temperature range as the film-forming temperature range. Since no plasma source is needed, it is possible to reduce the manufacturing cost of a substrate processing apparatus. Moreover, it becomes easy to remove fluorine remaining within a process chamber after cleaning. These effects may not be attained if cleaning is performed by plasma etching.

Other Embodiments

While one embodiment of the present disclosure has been described in detail above, the present disclosure is not limited to the foregoing embodiment but may be modified in many different forms without departing from the scope thereof.

For example, the buffer chamber 237 may not be provided within the process chamber 201 and the $O_2$ gas and the $H_2$ gas may be directly supplied into the process chamber 201 from the fourth nozzle 249d. In this case, the $O_2$ gas and the $H_2$ gas can be directly supplied toward the wafers 200 by arranging the gas supply ports 250d of the fourth nozzle 249d to face the center of the reaction tube 203. In an alternate embodiment, only the buffer chamber 237 may be provided with no provision of the fourth nozzle 249d.

In another example, the $C_3H_6$ gas, the $NH_3$ gas, the $O_2$ gas and the $H_2$ gas supplied into the process chamber 201 may not be thermally activated but may be activated through the use of, e.g., plasma. In this case, the respective gases may be plasma-excited by use of, e.g., a plasma generator described above.

In the embodiment described above, a SiCN film is formed by performing a process cycle including Steps 1, 2 and 3 once or more. However, the present disclosure may be applied to a case in which a SiN film is formed by performing a process cycle including Steps 1 and 3 once or more, or a case in which a Si film is formed by performing only Step 1. In addition, the present disclosure may be applied to a case in which a step of supplying an $O_2$ gas into the process chamber 201 is added as Step 4 and a SiOCN film is formed by performing a process cycle including Steps 1, 2, 3 and 4 once or more. Moreover, the present disclosure may be applied to a case in which a SiON film is formed by performing a process cycle including Steps 1, 3 and 4 once or more. In this manner, the present disclosure can be applied to a formation of a variety of films primarily composed of Si or SiN.

In the embodiment described above, as shown in FIG. 7A, a deposit including a thin film (such as a SiCN film or a SiN film) adhering to the inside of the reaction tube is removed by simultaneously supplying a fluorine-containing gas ($NF_3$ gas), an oxygen-containing gas ($O_2$ gas) and a hydrogen-containing gas ($H_2$ gas), as the cleaning gas, into the heated reaction tube kept at a pressure less than the atmospheric pressure.

However, the present disclosure is not limited to the above embodiment. As shown in FIG. 7B, the supply of the fluorine-containing gas ($NF_3$ gas) into the reaction tube may precede the supply of the oxygen-containing gas ($O_2$ gas) and the hydrogen-containing gas ($H_2$ gas) into the reaction tube. If the $NF_3$ gas, the $O_2$ gas and the $H_2$ gas are simultaneously supplied into the reaction tube, in some cases, SiCN as an etching target is partially exposed to only the $O_2$ gas and the $H_2$ gas (including the reactive species generated by the reaction of the $O_2$ gas and the $H_2$ gas) and is oxidized by them, which makes it difficult to etch SiCN. In contrast, if the $NF_3$ gas is supplied prior to supplying the $O_2$ gas and the $H_2$ gas as shown in FIG. 7B, it restrains SiCN as an etching target from being partially exposed to only the $O_2$ gas and the $H_2$ gas (including the reactive species generated by the reaction of the $O_2$ gas and the $H_2$ gas) and being oxidized by them. This facilitates etching of SiCN within the reaction tube.

Figure 7C:
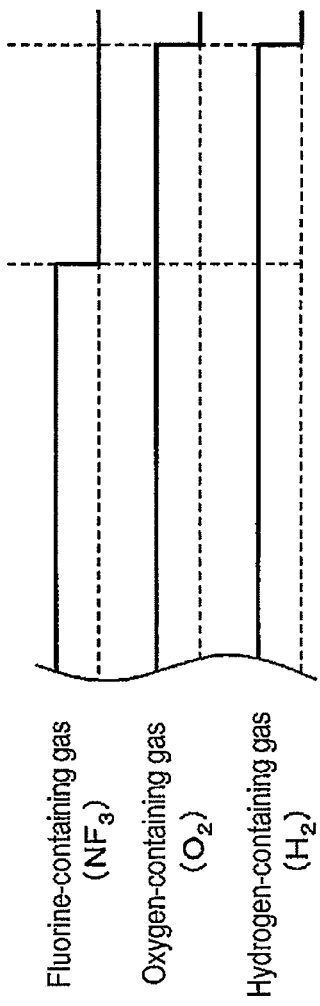
FIG. 7C is a gas supply timing chart showing a situation in which the oxygen-containing gas and the hydrogen-containing gas are continuously supplied after stopping the supply of the fluorine-containing gas.

Further, as shown in FIG. 7C, the oxygen-containing gas ($O_2$ gas) and the hydrogen-containing gas ($H_2$ gas) may be continuously supplied into the reaction tube even after the supply of the fluorine-containing gas ($NF_3$ gas) into the reaction tube is stopped at the end of deposit removal. This facilitates discharging cleaning gas residues (such as residual fluorine) from the reaction tube. In other words, if the supply of the $O_2$ gas and the $H_2$ gas into the reaction tube is maintained even after stopping the supply of the $NF_3$ gas into the reaction tube, the $H_2$ gas supplied into the reaction tube reacts with the residual fluorine (F) to generate HF, thereby consuming the residual fluorine remaining within the reaction tube. In addition, the residual fluorine is substituted by the atomic oxygen (O) generated by the reaction of the $O_2$ gas and the $H_2$ gas supplied into the reaction tube or the $O_2$ gas, consequently removing the residual fluorine remaining within the reaction tube. By discharging the cleaning gas residues from the inside of the reaction tube in this manner, it becomes possible to enhance the repeatability of film formation processing in the next film-forming process and to prevent the wafers 200 from being contaminated with metal.

In the embodiment described above, a deposit including a thin film (such as a SiCN film or a SiN film) adhering to the inside of the reaction tube is removed by supplying a mixture of a fluorine-containing gas ($NF_3$ gas), an oxygen-containing gas ($O_2$ gas) and a hydrogen-containing gas ($H_2$ gas), as a cleaning gas, into the heated reaction tube kept at a pressure less than the atmospheric pressure and then exhausting the cleaning gas.

Figure 8:
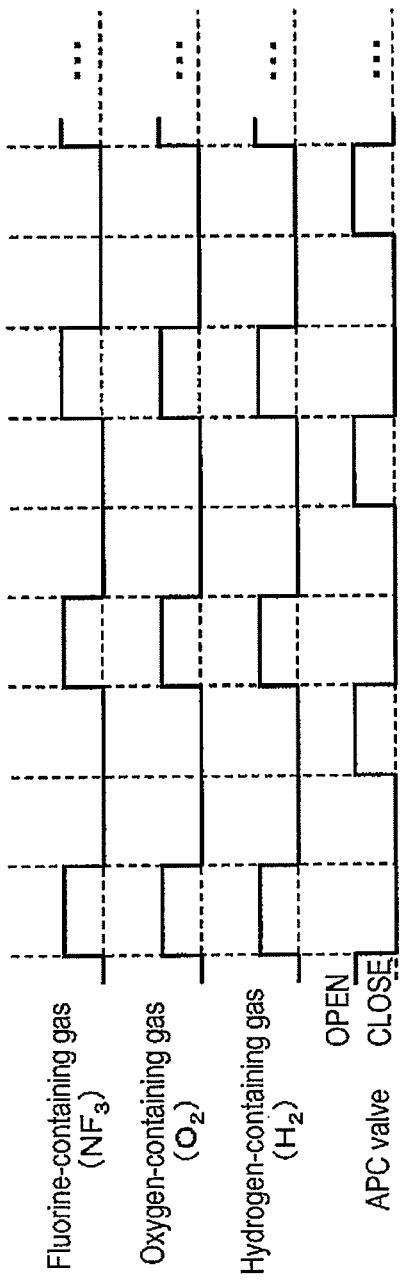
FIG. 8 is a gas supply timing chart showing a situation in which the confining and exhausting of the fluorine-containing gas, the oxygen-containing gas and the hydrogen-containing gas is repeated multiple times.

In the present disclosure, as shown in FIG. 8, a deposit including a thin film adhering to the inside of the reaction tube can also be cyclically removed by repeating multiple times a process cycle that includes a step of supplying a fluorine-containing gas, an oxygen-containing gas and a hydrogen-containing gas, as the cleaning gas, into a heated reaction tube kept at a pressure less than the atmospheric pressure and confining the fluorine-containing gas, the oxygen-containing gas and the hydrogen-containing gas within the reaction tube, and a step of subsequently vacuum-exhausting the inside of the reaction tube. In this case, when confining the fluorine-containing gas, the oxygen-containing gas and the hydrogen-containing gas within the reaction tube, the APC valve 244 of the exhaust pipe 231 is closed to block the exhaust pipe 231 and stop exhausting. When vacuum-exhausting the inside of the reaction tube, the APC valve 244 of the exhaust pipe 231 is opened to open the exhaust pipe 231 and resume exhausting. In other words, the fluorine-containing gas, the oxygen-containing gas and the hydrogen-containing gas are intermittently supplied into the reaction tube, and the inside of the reaction tube is intermittently exhausted. With this method, it is possible to increase the internal pressure of the reaction tube in the course of confining the fluorine-containing gas, the oxygen-containing gas and the hydrogen-containing gas within the reaction tube. This further increases the etching rate of a deposit while reducing damage to quartz. Moreover, it is possible to evenly diffuse the fluorine-containing gas, the oxygen-containing gas and the hydrogen-containing gas throughout the inside of the reaction tube in the course of confining them within the reaction tube. This makes it possible to uniformly remove the deposit adhering to the inside of the reaction tube. Further, if the fluorine-containing gas, the oxygen-containing gas and the hydrogen-containing gas are supplied and exhausted without confining the supplied gases within the reaction tube (i.e., if the gases are allowed to flow continuously), in some cases, the gas stream becomes stagnant, e.g., in the upper and lower areas within the reaction tube and in the gaps between the members within the reaction tube, consequently making it difficult for the gases to flow around the upper and lower areas and the gaps between the members within the reaction tube. In contrast, if the fluorine-containing gas, the oxygen-containing gas and the hydrogen-containing gas are confined within the reaction tube, it becomes possible for the gases to be uniformly distributed even in the areas where the gas stream otherwise would be stagnant (i.e., where the gases are hard to flow around).

Further, in the present disclosure, as shown in FIG. 9, a deposit including a thin film adhering to the inside of the reaction tube can also be removed by alternately supplying a fluorine-containing gas and an oxygen-containing gas plus a hydrogen-containing gas, as the cleaning gas, into a heated reaction tube kept at a pressure less than the atmospheric pressure. In other words, cleaning can also be implemented by alternately repeating the supply of the fluorine-containing gas into the heated reaction tube (kept at a pressure less than the atmospheric pressure) and the supply of the oxygen-containing gas and the hydrogen-containing gas into the heated reaction tube (kept at a pressure less than the atmospheric pressure).

EXAMPLES

Example 1

Next, description will be made for Example 1.

Samples of a poly-Si film, a SiN film, a SiCN film and a SiO film were prepared and subjected to cleaning, after which the etching rate of each of the samples was measured. The selective ratios of the poly-Si film, the SiN film and the SiCN film with respect to the SiO film, namely the ratios of the etching rates of the poly-Si film, the SiN film and the SiCN film to the etching rate of the SiO film, were calculated based on the measurement results. In Example 1, the SiO film was used in place of quartz with similar properties. Accordingly, assuming the etching rate of the SiO film to be the etching rate of quartz, the selective ratios of the poly-Si film, the SiN film and the SiCN film with respect to the SiO film are assumed to be the selective ratios of the poly-Si film, the SiN film and the SiCN film with respect to quartz. Since the etching rate of quartz is lower than the etching rate of the SiO film, it may be assumed that the actual selective ratios of the poly-Si film, the SiN film and the SiCN film with respect to quartz are greater than the corresponding values with respect to the SiO film available in Example 1. In the cleaning operation of Example 1, the following four types of gases were used as cleaning gases.

(1) $NF_3$ gas alone
(2) $NF_3$ gas added with a $H_2$ gas
(3) $NF_3$ gas added with an $O_2$ gas
(4) $NF_3$ gas added with an $O_2$ gas and a $H_2$ gas In the cleaning operation of Example 1, the internal temperature of the process chamber was set equal to 600° C. and the internal pressure of the process chamber was set equal to 865 Pa (6.5 Torr). The flow rates of the four types of gases were set as follows.

Figure 4:
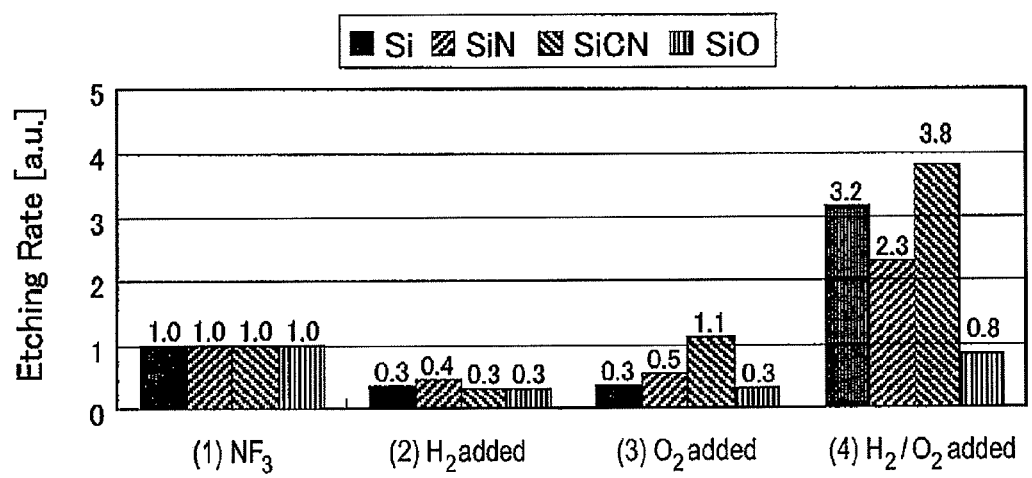
FIG. 4 is a graph representing the etching rates of a poly-Si film, a SiN film, a SiCN film and a SiO film, which change depending on the type of cleaning gas.

(1) $NF_3$ gas flow rate: 0.5 slm
(2) $NF_3$ gas flow rate: 0.5 slm, $H_2$ gas flow rate: 0.2 slm, and $N_2$ gas (diluent gas) flow rate: 0.3 slm
(3) $NF_3$ gas flow rate: 0.5 slm, $O_2$ gas flow rate: 0.3 slm, and $N_2$ gas (diluent gas) flow rate: 0.2 slm (4) $NF_3$ gas flow rate: 0.5 slm, $O_2$ gas flow rate: 0.3 slm, and $H_2$ gas flow rate: 0.2 slm The results are shown in FIG. 4, which is a graph representing the changes of the etching rates of the poly-Si film, the SiN film, the SiCN film and the SiO film, depending on the types of cleaning gases. The vertical axis in FIG. 4 denotes the etching rates (arbitrary unit: a.u.) and the horizontal axis signifies the types of cleaning gases (the four types of gases mentioned above). The expressions in the horizontal axis "(1) $NF_3$", "(2) $H_2$ added", "(3) $O_2$ added" and "(4) $H_2/O_2$ added" indicate, respectively, (1) the use of the $NF_3$ gas alone, (2) the use of the $NF_3$ gas added with the $H_2$ gas, (3) the use of the $NF_3$ gas added with the $O_2$ gas and (4) the use of the $NF_3$ gas added with the $O_2$ gas and the $H_2$ gas. The etching rates in FIG. 4 indicate the etching rate ratios when the etching rate available in case (1) the use of the $NF_3$ gas alone is set equal to 1 (reference value).

Referring to FIG. 4, it was confirmed that, when compared with (1) the use of the $NF_3$ gas alone, the etching rates of the poly-Si film, the SiN film, the SiCN film and the SiO film are not increased in case (2) the use of the $NF_3$ gas added with the $H_2$ gas. It was also confirmed that, in case (3) the use of the $NF_3$ gas added with the $O_2$ gas, when compared with (1) the use of the $NF_3$ gas alone, the etching rate of the SiCN film is slightly increased but the etching rates of the poly-Si film, the SiN film and the SiO film are not increased. In contrast, it was confirmed that, in case (4) the use of the $NF_3$ gas added with the $O_2$ gas and the $H_2$ gas, when compared with (1) the use of the $NF_3$ gas alone, the etching rates of the poly-Si film, the SiN film and the SiCN film are increased. In this case, it was confirmed that the etching rate of the SiO film is not increased.

Figure 5:
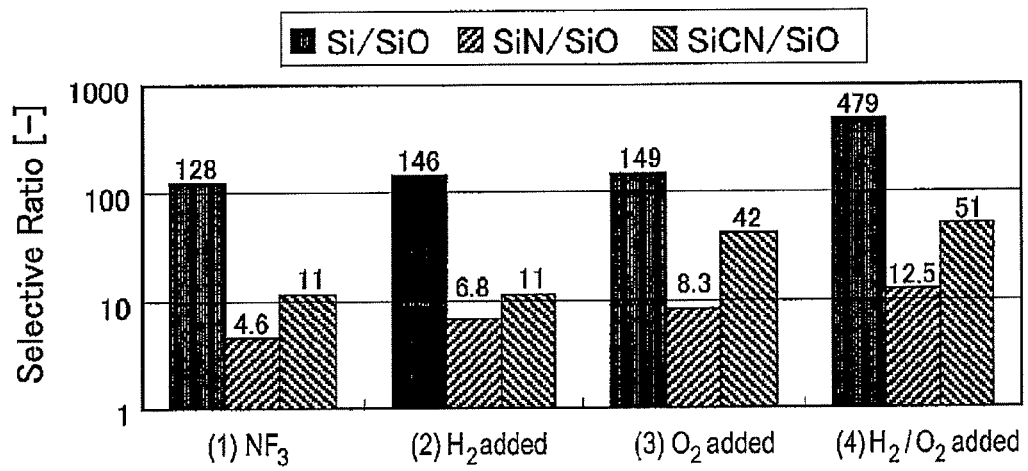
FIG. 5 is a graph representing the selective ratios of a poly-Si film, a SiN film and a SiCN film to a SiO film, which change depending on the type of cleaning gas.

FIG. 5 shows the selective ratios of the poly-Si film, the SiN film and the SiCN film with respect to the SiO film calculated based on the measurement results shown in FIG. 4. FIG. 5 is a graph representing the changes of the selective ratios of the poly-Si film, the SiN film and the SiCN film with respect to the SiO film, depending on the types of cleaning gases. The vertical axis in FIG. 5 denotes the selective ratios and the horizontal axis signifies the types of cleaning gases (the four types of gases mentioned above).

Referring to FIG. 5, it was confirmed that, in case (2) the use of the $NF_3$ gas added with the $H_2$ gas, when compared with (1) the use of the $NF_3$ gas alone, the selective ratios of the Si film and the SiN film to the SiO film are slightly increased but the selective ratio of the SiCN film to the SiO film is not increased. It was also confirmed that, in case (3) the use of the $NF_3$ gas added with the $O_2$ gas, when compared with (1) the use of the $NF_3$ gas alone, the selective ratios of the Si film and the SiN film to the SiO film are slightly increased and the selective ratio of the SiCN film to the SiO film is increased. In contrast, it was confirmed that, in case (4) the use of the $NF_3$ gas added with the $O_2$ gas and the $H_2$ gas, when compared with (1) the independent use of the $NF_3$ gas, the selective ratios of the poly-Si film, the SiN film and the SiCN film to the SiO film are significantly increased. These results indicate that the use of the $NF_3$ gas added with the $O_2$ gas and the $H_2$ gas as a cleaning gas reduces damage to quartz (SiO) used as a base material, even when excessive cleaning is performed to remove the poly-Si film, the SiN film and the SiCN film deposited in the inside of the quartz-made reaction tube or on the surface of the quartz-made boat.

Example 2

Next, description will be made for Example 2.

Samples of a poly-Si film, a SiN film, a SiCN film and a SiO film were prepared and subjected to cleaning through the use of a $NF_3$ gas added with the $O_2$ gas and the $H_2$ gas as a cleaning gas, after which the etching rate of each of the samples was measured. In the cleaning operation of Example 2, the internal temperature of the process chamber was set equal to 600° C. The flow rate of the $NF_3$ gas was 0.5 slm, the flow rate of the $O_2$ gas was 0.3 slm and the flow rate of the $H_2$ gas was 0.2 slm. The internal pressure of the process chamber was changed to different values.

Figure 6:
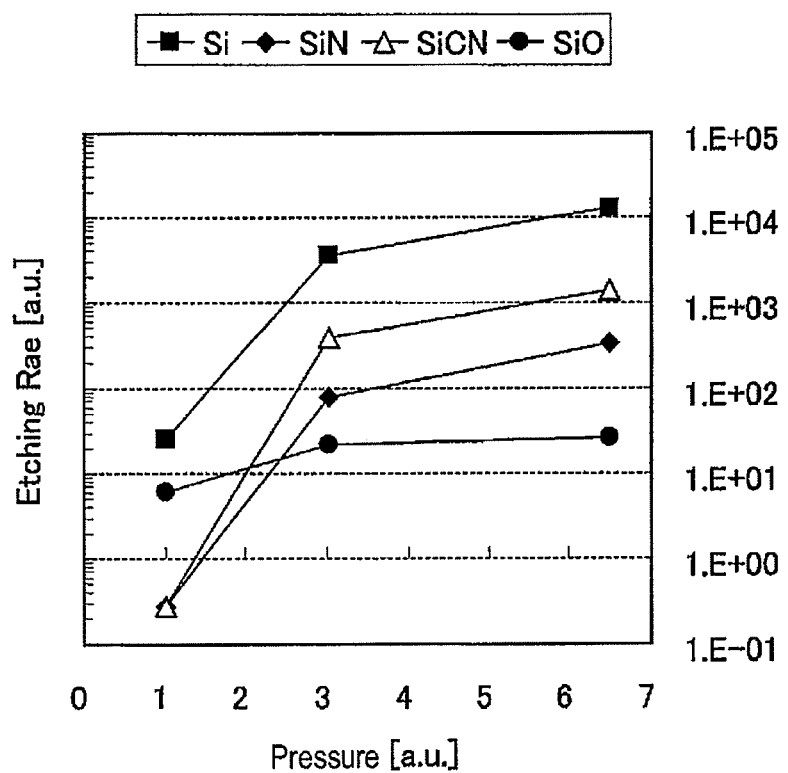
FIG. 6 is a graph representing the etching rates of a poly-Si film, a SiN film, a SiCN film and a SiO film when an $O_2$ gas and a $H_2$ gas are simultaneously added to an $NF_3$ gas, which change depending on the pressure change.

The results are shown in FIG. 6, which is a graph representing the changes of the etching rates of the poly-Si film, the SiN film, the SiCN film and the SiO film when the $O_2$ gas and the $H_2$ gas are simultaneously added to the $NF_3$ gas, depending on the pressure within the process chamber. The vertical axis in FIG. 6 denotes the etching rates (arbitrary unit: a.u.) and the horizontal axis signifies the internal pressure of the process chamber (arbitrary unit: a.u.). The etching rates in FIG. 6 indicate the etching rate ratios when one of the etching rates is set equal to 1 (reference value).

Referring to FIG. 6, it was confirmed that the etching rates of the poly-Si film, the SiN film and the SiCN film are significantly increased along with the increase in the internal pressure of the process chamber. In contrast, it was confirmed that the etching rate of the SiO film is slightly increased along with the increase in the internal pressure of the process chamber, the percentage of the increase in the etching rate of the SiO film staying small. These results indicate that, if the $NF_3$ gas added with the $O_2$ gas and the $H_2$ gas is used as a cleaning gas and if the internal pressure of the process chamber is increased when removing the poly-Si film, the SiN film and the SiCN film deposited in the inside of the quartz-made reaction tube or on the surface of the quartz-made boat, it is possible to increase the etching rates of the poly-Si film, the SiN film and the SiCN film while reducing damage to quartz (SiO) used as a base material.

Hereinafter, some additional aspects of the present disclosure will be additionally stated.

A first aspect of the present disclosure provides a method of manufacturing a semiconductor device, including: supplying a process gas into a process vessel accommodating a substrate to form a thin film on the substrate; and supplying a cleaning gas into the process vessel to clean an inside of the process vessel, after the supplying the process gas to form the thin film is performed a predetermined number of times, wherein, when cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including the thin film adhering to the inside of the process vessel through a thermochemical reaction.

The process vessel may be made of quartz.

The deposit may be removed under a non-plasma atmosphere.

The deposit may be removed by thermal etching.

The supply of the fluorine-containing gas into the process vessel may be performed prior to the supply of the oxygen-containing gas and the hydrogen-containing gas into the process vessel.

The supply of the oxygen-containing gas and the hydrogen-containing gas into the process vessel may be continuously performed even after the supply of the fluorine-containing gas into the process vessel is stopped after removal of the deposit.

The supply of the oxygen-containing gas and the hydrogen-containing gas into the process vessel may be continuously performed even after the supply of the fluorine-containing gas into the process vessel is stopped after removal of the deposit, such that fluorine remaining within the process vessel is discharged after reacting with reactive species generated by reaction of the oxygen-containing gas and the hydrogen-containing gas within the process vessel heated and kept at the pressure less than the atmospheric pressure.

Fluorine remaining within the process vessel may be discharged after reacting with the oxygen-containing gas and the reactive species.

Fluorine remaining within the process vessel may be discharged after reacting with the oxygen-containing gas, the hydrogen-containing gas and the reactive species.

The fluorine-containing gas may be a nitrogen fluoride gas, a fluorine gas, a chlorine fluoride gas or a hydrogen fluoride gas.

The oxygen-containing gas may be an oxygen gas, an ozone gas, a nitrogen monoxide gas or a nitrous oxide gas.

The hydrogen-containing gas may be a hydrogen gas, a deuterium gas, an ammonia gas or a methane gas.

The fluorine-containing gas may be a nitrogen fluoride gas, the oxygen-containing gas may be an oxygen gas and the hydrogen-containing gas may be a hydrogen gas.

A second aspect of the present disclosure provides a method of cleaning an inside of a process vessel, including: providing a process vessel in which a process to form a thin film on a substrate is performed; and supplying a cleaning gas into the process vessel to clean the inside of the process vessel, after the process to form the thin film is performed a predetermined number of times, wherein, when cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including the thin film adhering to the inside of the process vessel through a thermochemical reaction.

A third aspect of the present disclosure provides a substrate processing apparatus including: a process vessel configured to accommodate a substrate; a process gas supply system configured to supply a process gas into the process vessel; a cleaning gas supply system configured to supply a cleaning gas into the process vessel; a heater configured to heat an inside of the process vessel; a pressure regulator configured to regulate an internal pressure of the process vessel; and a controller configured to control the process gas supply system, the cleaning gas supply system, the heater and the pressure regulator such that, after supplying the process gas into the process vessel accommodating the substrate to form a thin film on the substrate is performed a predetermined number of times, the cleaning gas is supplied into the process vessel to clean the inside of the process vessel, and such that, when cleaning the inside of the process vessel, a fluorine-containing gas, an oxygen-containing gas and a hydrogen-containing gas are supplied as the cleaning gas into the process vessel heated and kept at a pressure less than an atmospheric pressure to remove a deposit including the thin film adhering to the inside of the process vessel through a thermochemical reaction.

According to the above embodiments of the present disclosure, it is possible to provide a method of manufacturing a semiconductor device, a method of cleaning an inside of a process vessel and a substrate processing apparatus, which are capable of realizing a cleaning operation meeting two conflicting requirements, i.e., reduction of damage to quartz and increase of deposit etching rate within the process vessel.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   supplying a process gas into a process vessel accommodating a substrate to form a thin film on the substrate; and
   supplying a cleaning gas into the process vessel during a cleaning process to clean an inside of the process vessel, after supplying the process gas to form the thin film is performed a predetermined number of times;
   wherein, in at least one time period during the cleaning process, all of a fluorine-containing gas, an oxygen-containing gas and a hydrogen-containing gas are simultaneously supplied as the cleaning gas into the process vessel heated and kept at a pressure less than an atmospheric pressure to remove a deposit including the thin film adhering to the inside of the process vessel through a thermochemical reaction, all of the fluorine-containing gas, the oxygen-containing gas and the hydrogen-containing gas being thermally activated under a non-plasma atmosphere.

2. The method of claim 1, wherein the process vessel is made of quartz.

3. The method of claim 1, wherein the deposit is removed under a non-plasma atmosphere.

4. The method of claim 1, wherein the deposit is removed by thermal etching.

5. The method of claim 1, wherein the supply of the fluorine-containing gas into the process vessel is performed prior to the at least one time period.

6. The method of claim 1, wherein the supply of the oxygen-containing gas and the hydrogen-containing gas into the process vessel is continuously performed even after the at least one time period.

7. The method of claim 1, wherein the supply of the oxygen-containing gas and the hydrogen-containing gas into the process vessel is continuously performed even after the at least one time period, such that fluorine remaining within the process vessel is discharged after reacting with reactive species generated by reaction of the oxygen-containing gas and the hydrogen-containing gas within the process vessel heated and kept at the pressure less than the atmospheric pressure.

8. The method of claim 1, wherein the fluorine-containing gas is at least one kind of gas selected from the group consisting of a nitrogen fluoride gas, a fluorine gas, a chlorine fluoride gas and a hydrogen fluoride gas; the oxygen-containing gas being at least one kind of gas selected from the group consisting of an oxygen gas, an ozone gas, a nitrogen monoxide gas and a nitrous oxide gas; the hydrogen-containing gas being at least one kind of gas selected from the group consisting of a hydrogen gas, a deuterium gas, an ammonia gas and a methane gas.

9. The method of claim 1, wherein the fluorine-containing gas, the oxygen-containing gas and the hydrogen-containing gas are mixed mutually in the process vessel.

10. The method of claim 1, wherein the fluorine-containing gas, the oxygen-containing gas and the hydrogen-containing gas react mutually in the process vessel.

11. The method of claim 1, wherein the fluorine-containing gas, the oxygen-containing gas and the hydrogen-containing gas react mutually, and thereby etching species is generated in the process vessel.

12. The method of claim 1, wherein the fluorine-containing gas, the oxygen-containing gas and the hydrogen-containing gas are intermittently supplied into the process vessel.

13. The method of claim 1, wherein, when cleaning the inside of the process vessel, a cycle is repeated multiple times, the cycle comprising:
  (a) simultaneously supplying the fluorine-containing gas, the oxygen-containing gas and the hydrogen-containing gas into the process vessel;
  (b) simultaneously confining the fluorine-containing gas, the oxygen-containing gas and the hydrogen-containing gas within the process vessel; and
  (c) exhausting the inside of the process vessel.

14. The method of claim 1, wherein, when cleaning the inside of the process vessel, a cycle is repeated multiple times, the cycle comprising:
  (a) supplying the fluorine-containing gas, the oxygen-containing gas and the hydrogen-containing gas into the process vessel in a state that a exhaust pipe, through which the inside of the process vessel is exhausted, is blocked;
  (b) confining the fluorine-containing gas, the oxygen-containing gas and the hydrogen-containing gas within the process vessel in the state that the exhaust pipe is blocked; and
  (c) exhausting the inside of the process vessel in a state that the exhaust pipe is opened.

15. The method of claim 1, wherein, when cleaning the inside of the process vessel, a cycle is repeated multiple times, the cycle comprising:
  (a) supplying the fluorine-containing gas, the oxygen-containing gas and the hydrogen-containing gas into the process vessel in a state that a valve provided in a exhaust pipe, through which the inside of the process vessel is exhausted, is closed;
  (b) confining the fluorine-containing gas, the oxygen-containing gas and the hydrogen-containing gas within the process vessel in the state that the valve is closed; and
  (c) exhausting the inside of the process vessel in a state that the valve is opened.

16. A method of cleaning an inside of a process vessel, comprising:
  providing a process vessel in which a process to form a thin film on a substrate is performed; and
  supplying a cleaning gas into the process vessel during a cleaning process to clean the inside of the process vessel, after the process to form the thin film is performed a predetermined number of times;
  wherein, in at least one time period during the cleaning process, all of a fluorine-containing gas, an oxygen-containing gas and a hydrogen-containing gas are simultaneously supplied as the cleaning gas into the process vessel heated and kept at a pressure less than an atmospheric pressure to remove a deposit including the thin film adhering to the inside of the process vessel through a thermochemical reaction, all of the fluorine-containing gas, the oxygen-containing gas and the hydrogen-containing gas being thermally activated under a non-plasma atmosphere.

17. A method of manufacturing a semiconductor device, comprising:
  supplying a process gas into a process vessel accommodating a substrate to form a thin film on the substrate; and
  supplying a cleaning gas into the process vessel during a cleaning process to clean an inside of the process vessel, after supplying the process gas to form the thin film is performed a predetermined number of times;
  wherein, in at least one time period during the cleaning process, all of a fluorine-containing gas, an oxygen-containing gas and a hydrogen-containing gas are simultaneously and intermittently supplied as the cleaning gas into the process vessel heated and kept at a pressure less than an atmospheric pressure to remove a deposit including the thin film adhering to the inside of the process vessel through a thermochemical reaction, all of the fluorine-containing gas, the oxygen-containing gas and the hydrogen-containing gas being thermally activated under a non-plasma atmosphere.

* * * * *